(12) United States Patent
Kim et al.

(10) Patent No.: US 12,035,600 B2
(45) Date of Patent: Jul. 9, 2024

(54) DISPLAY DEVICE INCLUDING INORGANIC DEPOSITION LAYER ON LIGHT EMITTING ELEMENT

(71) Applicant: Samsung Display Co., LTD., Yongin-si (KR)

(72) Inventors: Woo Young Kim, Yongin-si (KR); Hyeo Ji Kang, Seoul (KR); Oh Jeong Kwon, Hwaseong-si (KR); Kyeong Jong Kim, Incheon (KR); Hong Yeon Lee, Suwon-si (KR); Sung Gyu Jang, Anyang-si (KR); Seung Yeon Jeong, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/875,299

(22) Filed: Jul. 27, 2022

(65) Prior Publication Data
US 2023/0189616 A1  Jun. 15, 2023

(30) Foreign Application Priority Data
Dec. 13, 2021  (KR) .......................... 10-2021-0177711

(51) Int. Cl.
*H10K 59/40* (2023.01)
*G06F 3/044* (2006.01)
(Continued)

(52) U.S. Cl.
CPC ........... *H10K 59/40* (2023.02); *G06F 3/0446* (2019.05); *H10K 50/844* (2023.02); *H10K 50/865* (2023.02); *H10K 59/122* (2023.02)

(58) Field of Classification Search
CPC ............. H01L 51/5284; H01L 51/5281; H01L 2251/558; H01L 27/3246; G06F 3/0445
See application file for complete search history.

(56) References Cited

U.S. PATENT DOCUMENTS

2013/0242212 A1* 9/2013 Huang ................ H01L 51/5281
313/504
2016/0104869 A1* 4/2016 Choi ................... H01L 51/5246
257/40
(Continued)

FOREIGN PATENT DOCUMENTS

KR  1020110049477  5/2011
KR  1020130036843  4/2013
(Continued)

OTHER PUBLICATIONS

Nagwa, NPL article "Lesson Explainer: Oxidation Numbers", Published on line on Apr. 17, 2021 (https://web.archive.org/web/20210417133557/https://www.nagwa.com/en/explainers/853143634603/) (Year: 2021).*

*Primary Examiner* — Yuzhen Shen
(74) *Attorney, Agent, or Firm* — CANTOR COLBURN LLP

(57) ABSTRACT

A display device includes: a substrate; a first electrode on the substrate; a bank layer partially exposing a top surface of the first electrode; a light emitting layer disposed on the partially exposed top surface of the first electrode; a second electrode on the light emitting layer and the bank layer; an inorganic deposition layer on the second electrode; and a thin film encapsulation layer on the inorganic deposition layer, where at a wavelength of about 550 nm, an absorption coefficient (k) of the inorganic deposition layer is less than about 4.

13 Claims, 21 Drawing Sheets

(51) Int. Cl.
*H10K 50/844* (2023.01)
*H10K 50/86* (2023.01)
*H10K 59/122* (2023.01)

(56) References Cited

U.S. PATENT DOCUMENTS

| | | | | |
|---|---|---|---|---|
| 2016/0133880 A1* | 5/2016 | Lee | ...................... | H10K 50/828 |
| | | | | 257/40 |
| 2016/0231482 A1* | 8/2016 | Hasegawa | ............ | G02B 13/005 |
| 2017/0373282 A1* | 12/2017 | Kim | .................... | H01L 51/5234 |
| 2021/0143227 A1* | 5/2021 | Ikeda | .................. | H01L 51/5218 |

FOREIGN PATENT DOCUMENTS

| | | | | |
|---|---|---|---|---|
| KR | 20160139987 A | * 12/2016 | ......... | H01L 31/0216 |
| WO | WO-2008023802 A1 | * 2/2008 | ............. | G02B 1/105 |

* cited by examiner

DISPLAY DEVICE INCLUDING INORGANIC DEPOSITION LAYER ON LIGHT EMITTING ELEMENT

This application claims priority to Korean Patent Application No. 10-2021-0177711, filed on Dec. 13, 2021, and all the benefits accruing therefrom under 35 U.S.C. § 119, the content of which in its entirety is herein incorporated by reference.

BACKGROUND

1. Technical Field

The present disclosure relates to a display device, and more particularly, to a display device including a touch member.

2. Description of the Related Art

An electronic device providing images to users, such as a smartphone, a tablet PC, a digital camera, a laptop computer, a navigation device and a smart television, includes a display device for displaying images. The display device includes a display panel for generating and displaying an image and various input devices.

Meanwhile, when external light is incident from the upper side of the display panel, it is reflected by a cathode electrode, and the external light reflected by the cathode electrode may be visually recognized by a user. To this end, efforts have been made to reduce the external light reflected by the cathode electrode by forming an inorganic deposition layer on the cathode electrode.

SUMMARY

Aspects of the present disclosure provide a display device that suppresses reflection of external light.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, a display device includes: a substrate; a first electrode on the substrate; a bank layer partially exposing a top surface of the first electrode; a light emitting layer disposed on the partially exposed top surface of the first electrode; a second electrode on the light emitting layer and the bank layer; an inorganic deposition layer on the second electrode; and a thin film encapsulation layer on the inorganic deposition layer, where at a wavelength of about 550 nm, an absorption coefficient (k) of the inorganic deposition layer is less than about 4.

According to another embodiment, a display device includes: a substrate; a plurality of first electrodes on the substrate; a bank layer partially exposing each of top surfaces of the plurality of first electrodes; a light emitting layer disposed on each of the partially exposed top surfaces of the plurality of first electrodes; a second electrode on the light emitting layer and the bank layer; N inorganic deposition layers (N being a natural number greater than or equal to 1) on the second electrode; a thin film encapsulation layer including at least one inorganic layer and at least one organic layer and disposed on the inorganic deposition layer; a touch layer on the thin film encapsulation layer; and an anti-reflection member on the touch layer, wherein the inorganic deposition layer contains at least one of silver (Ag), magnesium (Mg), manganese (Mn), bismuth (Bi), ytterbium (Yb), zinc (Zn), tellurium (Te), or selenium (Se).

In accordance with the display device according to embodiments, the reflection of external light may be effectively suppressed.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
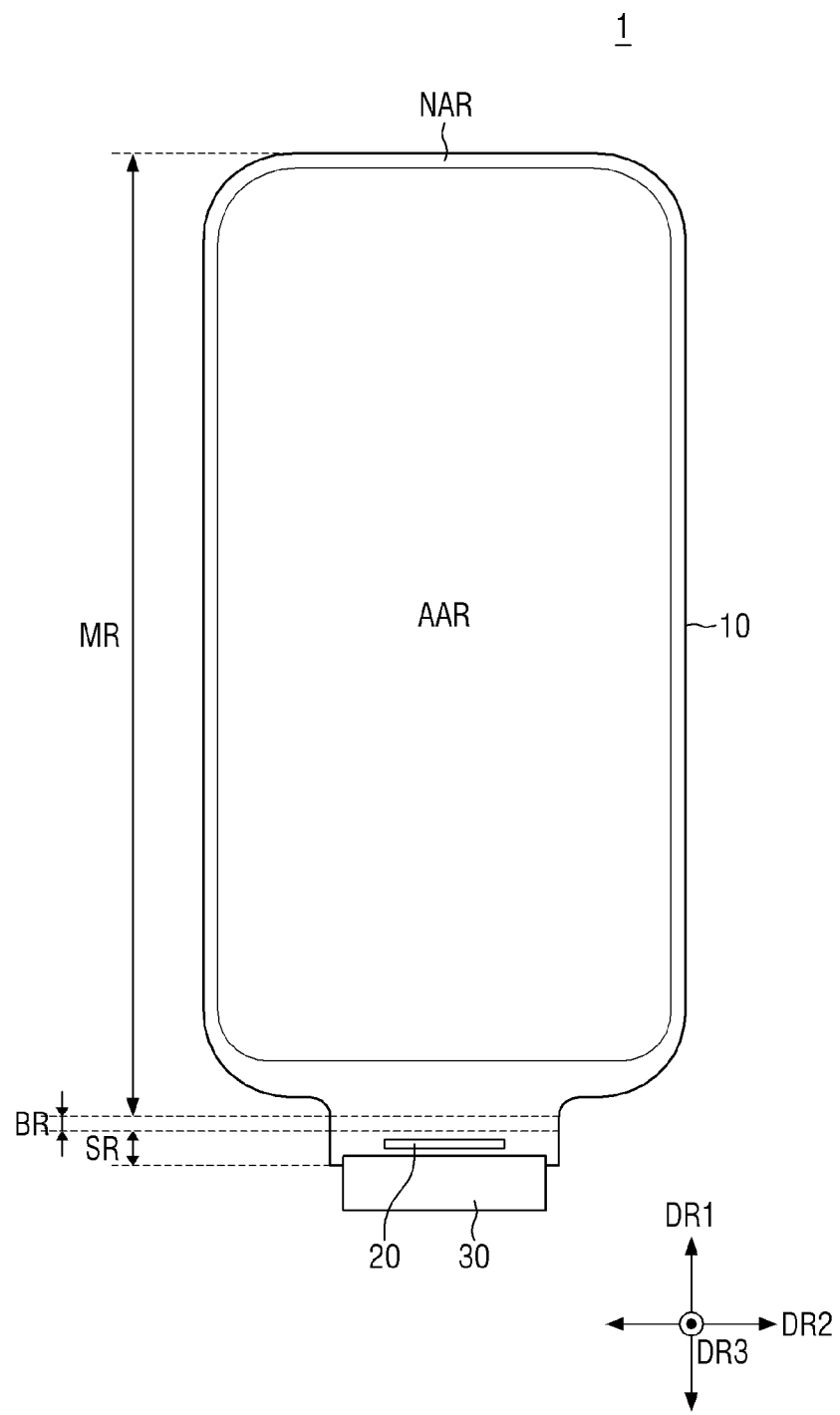
FIG. 1 is a plan view of a display device according to one embodiment.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
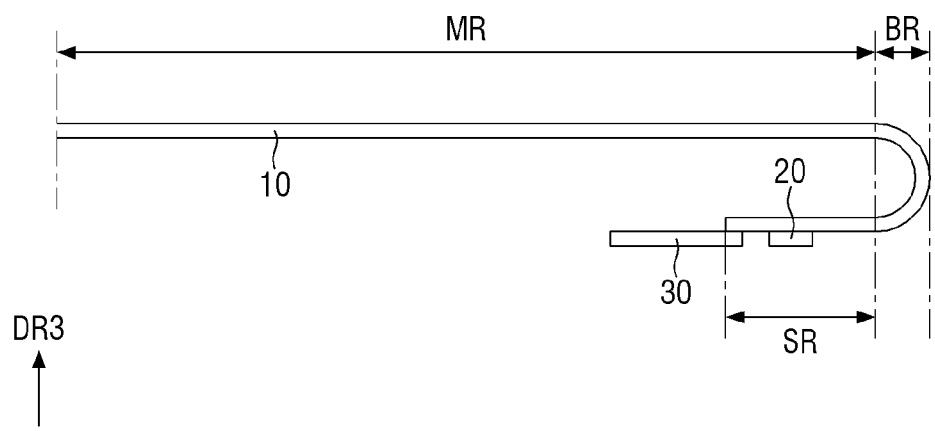
FIG. 2 is a schematic partial cross-sectional view of a display device according to one embodiment.

FIG. 1 is a plan view of a display device according to one embodiment. FIG. 2 is a schematic partial cross-sectional view of a display device according to one embodiment.

In the embodiments, a first direction DR1 and a second direction DR2 cross each other in different directions. In the plan view of FIG. 1, the vertical direction is defined as the first direction DR1 and the horizontal direction is defined as the second direction DR2 for simplicity of explanation. In the following embodiments, one side of the first direction DR1 represents an upward direction in a plan view, and the other side of the first direction DR1 represents a downward direction in a plan view. One side of the second direction DR2 represents a rightward direction in a plan view, and the other side of the second direction DR2 represents a leftward direction in a plan view. A third direction DR3 is a direction perpendicular to the first direction DR1 and the second direction DR2. Here, the "plan view" is defined as a view in the third direction DR3. It should be understood, however, that a direction mentioned in the embodiment refers to a relative direction and the embodiment is not limited to the direction mentioned.

Referring to FIGS. 1 and 2, a display device 1 may refer to any electronic device providing a display screen. Examples of the display device 1 may include a television, a laptop computer, a monitor, a billboard, an Internet-of-Things device and the like as well as portable electronic devices such as a mobile phone, a smartphone, a tablet personal computer ("PC"), an electronic watch, a smart watch, a watch phone, a mobile communication terminal, an electronic notebook, an electronic book, a portable multimedia player ("PMP"), a navigation device, a game machine, a digital camera, which provide a display screen.

The display device 1 includes an active region AAR and a non-active region NAR. In the display device 1, on the assumption that an area where a screen is displayed is defined as a display area, an area where a screen is not displayed is defined as a non-display area, and an area where a touch input is detected is defined as a touch area, the display area and the touch area may be included in the active region AAR. The display area and the touch area may overlap each other in a plan view. In other words, the active region AAR may be a region where the screen is displayed and the touch input is detected.

The active region AAR may have a rectangular shape or a rectangular shape with rounded corners. The illustrated active region AAR has a rectangular shape with rounded corners in which a side in the first direction DR1 is longer than a side in the second direction DR2. However, the present disclosure is not limited thereto, and the active region AAR may have various shapes such as a rectangle in which a side in the second direction DR2 is longer than a side in the first direction DR1, a square, other polygons, a circle, and an oval in another embodiment.

The non-active region NAR is disposed around the active region AAR. The non-active region NAR may be a bezel area. The non-active region NAR may surround all sides (four sides in the drawing) of the active region AAR. However, the present disclosure is not limited thereto, and for example, the non-active region NAR may not be disposed near the upper side or near the left and right sides of the active region AAR in another embodiment.

In the non-active region NAR, signal lines or driving circuits for applying a signal to the active region AAR may be disposed. The non-active region NAR may not include the display area. Furthermore, the non-active region NAR may not include the touch area. In another embodiment, the non-active region NAR may include a part of the touch area, and a sensor member such as a pressure sensor or the like may be disposed in that region. In some embodiments, the active region AAR may completely coincide with the display area where the screen is displayed, and the non-active region NAR may completely coincide with the non-display area where the screen is not displayed.

The display device 1 includes a display panel 10 which provides a display screen. Examples of the display panel 10 may include an organic light emitting display panel, a micro LED display panel, a nano LED display panel, a quantum dot light emitting display panel, a liquid crystal display panel, a plasma display panel, a field emission display panel, an electrophoretic display panel, an electrowetting display panel, and the like. In the following description, a case where an organic light emitting display panel is applied as the display panel 10 will be exemplified, but the present disclosure is not limited thereto, and other display panels may be applied within the same scope of technical spirit.

The display panel 10 may include a plurality of pixels. The plurality of pixels may be arranged in a matrix. The shape of each pixel may be a rectangular or square shape in a plan view. However, the present disclosure is not limited thereto, and it may be a rhombic shape in which each side is inclined with respect to a first direction DR1 in another embodiment. Each pixel may include an emission area. Each emission area may be the same as or different from the shape of the pixel. For example, when the shape of the pixel is a rectangular shape, the emission area of the corresponding pixel may have various shapes such as a rectangle, a rhombus, a hexagon, an octagon, and a circle. A detailed description of each pixel and the emission area will be made later.

The display device 1 may further include a touch member for detecting a touch input. The touch member may be provided as a panel or film separate from the display panel 10 and attached onto the display panel 10, but may also be provided in the form of a touch layer inside the display panel 10. In the following embodiment, a case in which the touch member is provided inside the display panel and included in the display panel 10 is illustrated, but the present disclosure is not limited thereto.

The display panel 10 may include a flexible substrate including a flexible polymer material such as polyimide. Accordingly, the display panel 10 may be curved, bent, folded, or rolled.

The display panel 10 may include a bending region BR, which is a region in which the panel is bendable. The display panel 10 may be divided into a main region MR located at one side of the bending region BR and a sub-region SR located at the other side of the bending region BR.

The display area of the display panel 10 is disposed in the main region MR. In one embodiment, a peripheral edge portion of the display area in the main region MR, the entire bending region BR, and the entire sub-region SR may be the non-display area. However, the present disclosure is not limited thereto, and the bending region BR and/or the sub-region SR may also include the display area in another embodiment.

The bending region BR is connected to one side of the main region MR in the first direction DR1. For example, the bending region BR may be connected to the main region MR through a lower short side of the main region MR. The width of the bending region BR may be smaller than the width (width of the short side: in the second direction DR2) of the main region MR. The connection portion between the main region MR and the bending region BR may have an L-shaped cutting shape in a plan view.

In the bending region BR, the display panel 10 may be bent downward in a thickness direction (third direction DR3), i.e., a direction opposite to a display surface. The bending region BR may have a constant radius of curvature. However, the present disclosure is not limited thereto, and the bending region BR may have a different radius of curvature for each section in another embodiment. The surface of the display panel 10 may be reversed as the display panel 10 is bent in the bending region BR. In other words, one surface of the display panel 10 facing upward may be changed to face outward through the bending region BR and then to face downward.

The sub-region SR extends from the bending region BR. The sub-region SR may extend in a direction parallel to the main region MR from a point where bending is completed. The sub-region SR may overlap the main region MR in the thickness direction DR3 of the display panel 10. The width of the sub-region SR (width in the second direction DR2 in FIG. 1) may be the same as the width of the bending region BR, but the present disclosure is not limited thereto.

A driving chip 20 may be disposed in the sub-region SR. The driving chip 20 may include an integrated circuit for driving the display panel 10. The integrated circuit may include a display integrated circuit and/or a touch unit integrated circuit. The display integrated circuit and the touch unit integrated circuit may be provided as separate chips or may be provided as one integrated chip.

A pad portion may be disposed at an end portion of the sub-region SR of the display panel 10. The pad portion may include a plurality of display signal wiring pads and touch signal wiring pads. A driving substrate 30 may be connected to the pad portion of the end portion of the sub-region SR of the display panel 10. The driving substrate 30 may be a flexible printed circuit board or film.

Figure 3:
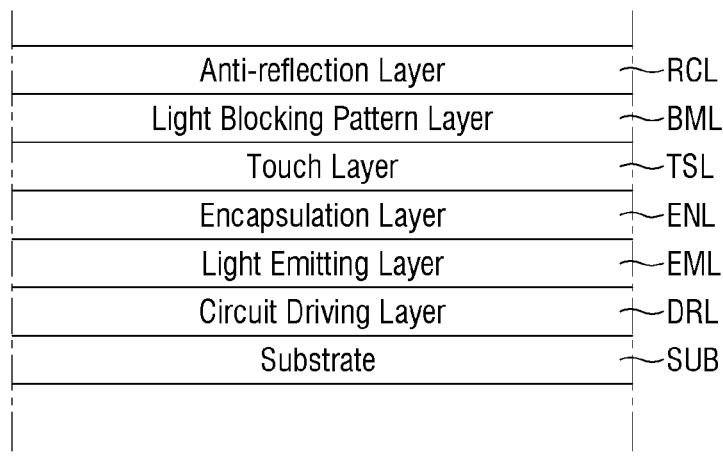
FIG. 3 is a schematic cross-sectional view illustrating an exemplary stacked structure of a display panel according to one embodiment.

FIG. 3 is a schematic cross-sectional view illustrating an exemplary stacked structure of a display panel according to one embodiment.

Referring to FIG. 3, the display panel 10 may include a circuit driving layer DRL disposed on a substrate SUB. The circuit driving layer DRL may include a circuit that drives the light emitting layer EML of the pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with various luminance levels according to a driving signal transmitted from the circuit driving layer DRL.

The encapsulation layer ENL may be disposed on the light emitting layer EML. The encapsulation layer ENL may include an inorganic layer or a laminated layer of an inorganic layer and an organic layer. As another example, the encapsulation layer ENL may be implemented with a glass or an encapsulation film.

The touch layer TSL may be disposed on the encapsulation layer ENL. The touch layer TSL is a layer for recognizing a touch input, and may function as a touch member. The touch layer TSL may include a plurality of sensing areas and sensing electrodes.

A light blocking pattern layer BML may be disposed on the touch layer TSL. The light blocking pattern layer BML may serve to reduce reflection of external light and improve a reflection color.

An anti-reflection layer RCL may be disposed on the light blocking pattern layer BML. The anti-reflection layer RCL may serve to reduce reflection of external light. The anti-reflection layer RCL may include a resin and an anti-reflection dye dispersed in the resin. The anti-reflection dye may include, but is not limited to, a porphyrin-based dye, a metal-porphyrin-based dye, methine, triazine, a dipyrromethene-based dye, tetraazaporphyrin, phthalocyanine, oxazine, cyanine, or squarylium.

In FIG. 3, the light blocking pattern layer BML and the anti-reflection layer RCL are illustrated as separate layers. However, the present disclosure is not limited thereto, and an anti-reflection member may be disposed on the touch layer TSL, and the anti-reflection member may include the light blocking pattern layer BML and the anti-reflection layer RCL in another embodiment.

In some embodiments, the anti-reflection layer RCL may be omitted, and a color filter layer may be disposed on the light blocking pattern layer BML. The color filter layer may include a red color filter, a green color filter, and a blue color filter. Each of the color filters may be disposed in each pixel. The color filters disposed in each pixel may improve a color purity of light emitted from the emission area corresponding to the pixel.

Hereinafter, the above-described touch member will be described in detail.

Figure 4:
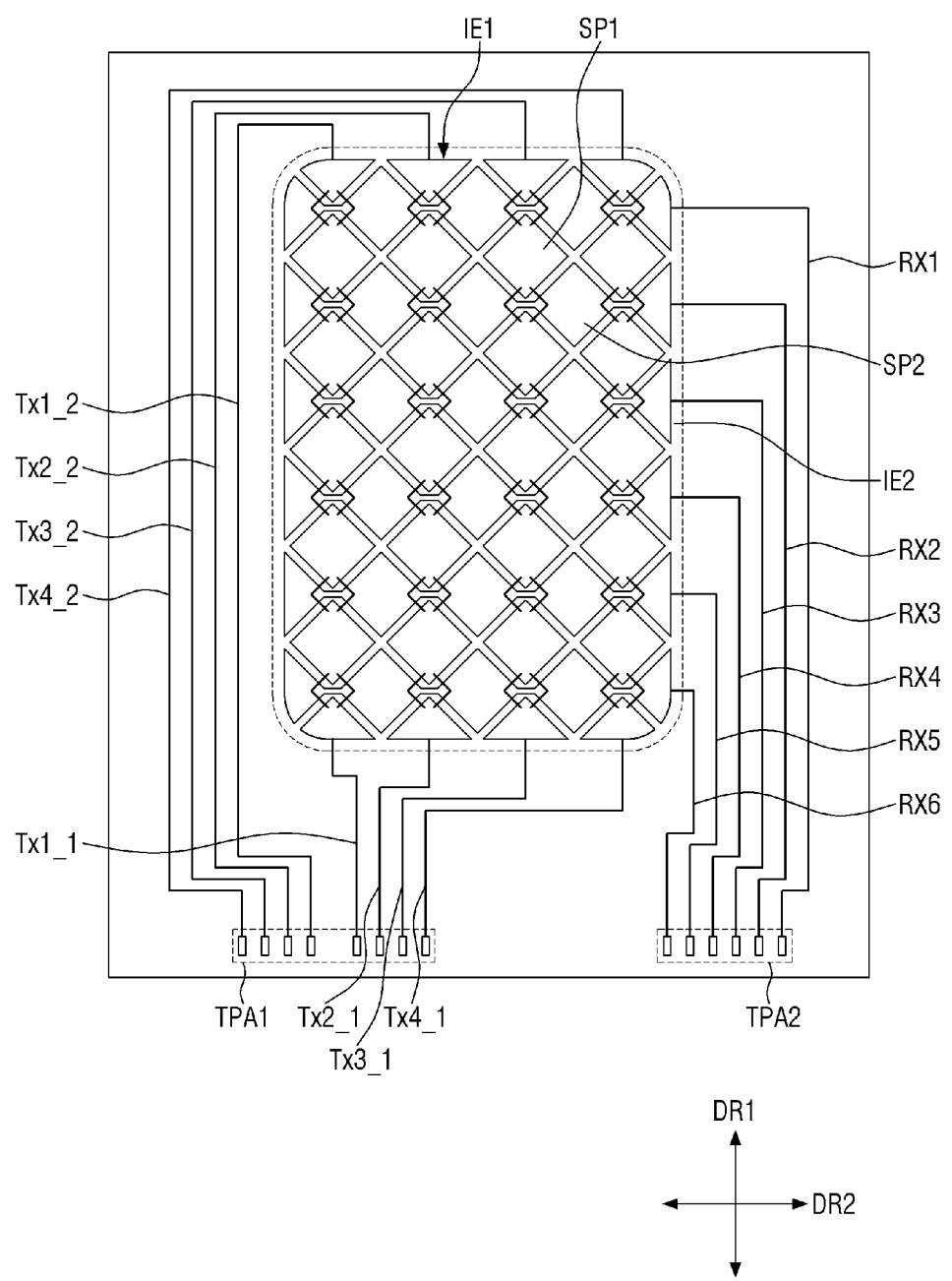
FIG. 4 is a schematic plan layout view of a touch member according to one embodiment.

FIG. 4 is a schematic plan layout view of a touch member according to one embodiment.

Referring to FIG. 4, the touch member may include a touch area positioned in the active region AAR and a non-touch area positioned in the non-active region NAR. In FIG. 4, for simplicity of description, the overall shape of the touch member is simplified and the non-touch area is illustrated as being relatively wide. However, the shape of the touch area and the shape of the non-touch area may be substantially the same as the above-described shapes of the active region AAR and the non-active region NAR.

The touch area of the touch member may include a plurality of first sensing electrodes IE1 (or first touch electrodes) and a plurality of second sensing electrodes IE2 (or second touch electrodes). One of the first sensing electrode IE1 and the second sensing electrode IE2 may be a driving electrode, and the other may be a sensing electrode. In this embodiment, a case is exemplified in which the first sensing electrode IE1 is a driving electrode and the second sensing electrode IE2 is a sensing electrode.

The first sensing electrode IE1 may extend in the first direction DR1. The first sensing electrode IE1 may include a plurality of first sensor portions SP1 arranged along the first direction DR1 and a first connection portion CP1 electrically connecting the adjacent first sensor portions SP1 to each other.

The plurality of first sensing electrodes IE1 may be arranged in the second direction DR2.

The second sensing electrode IE2 may extend in the second direction DR2. The second sensing electrode IE2 may include a plurality of second sensor portions SP2 arranged in the second direction DR2 and a second connection portion CP2 electrically connecting the adjacent second sensor portions SP2 to each other. The plurality of second sensing electrodes IE2 may be arranged in the first direction DR1.

Although the drawing illustrates a case where four first sensing electrodes IE1 and six second sensing electrodes IE2 are arranged, it is obvious that the number of the first sensing electrodes IE1 and the number of the second sensing electrodes IE2 are not limited to the above example.

At least some of the first sensor portions SP1 and the second sensor portions SP2 may have a rhombic shape. Some of the first sensor portions SP1 and the second sensor portions SP2 may have a shape of a figure cut from a rhombus. For example, all of the first sensor portions SP1 and the second sensor portions SP2 except for the sensor portions at both ends in their extension direction may have a rhombic shape, and each of the first sensor portions SP1 and the second sensor portions SP2 positioned at both ends in their extension direction may have a triangular shape obtained by cutting a rhombus in half. The rhombic first sensor portions SP1 and the rhombic second sensor portions SP2 may have substantially the same size and shape. The triangular first sensor portions SP1 and the triangular second sensor portions SP2 may have substantially the same size and shape. However, the embodiment is not limited to the above example, and the shapes and sizes of the first sensor portion SP1 and the second sensor portion SP2 may be variously modified.

Figure 5:
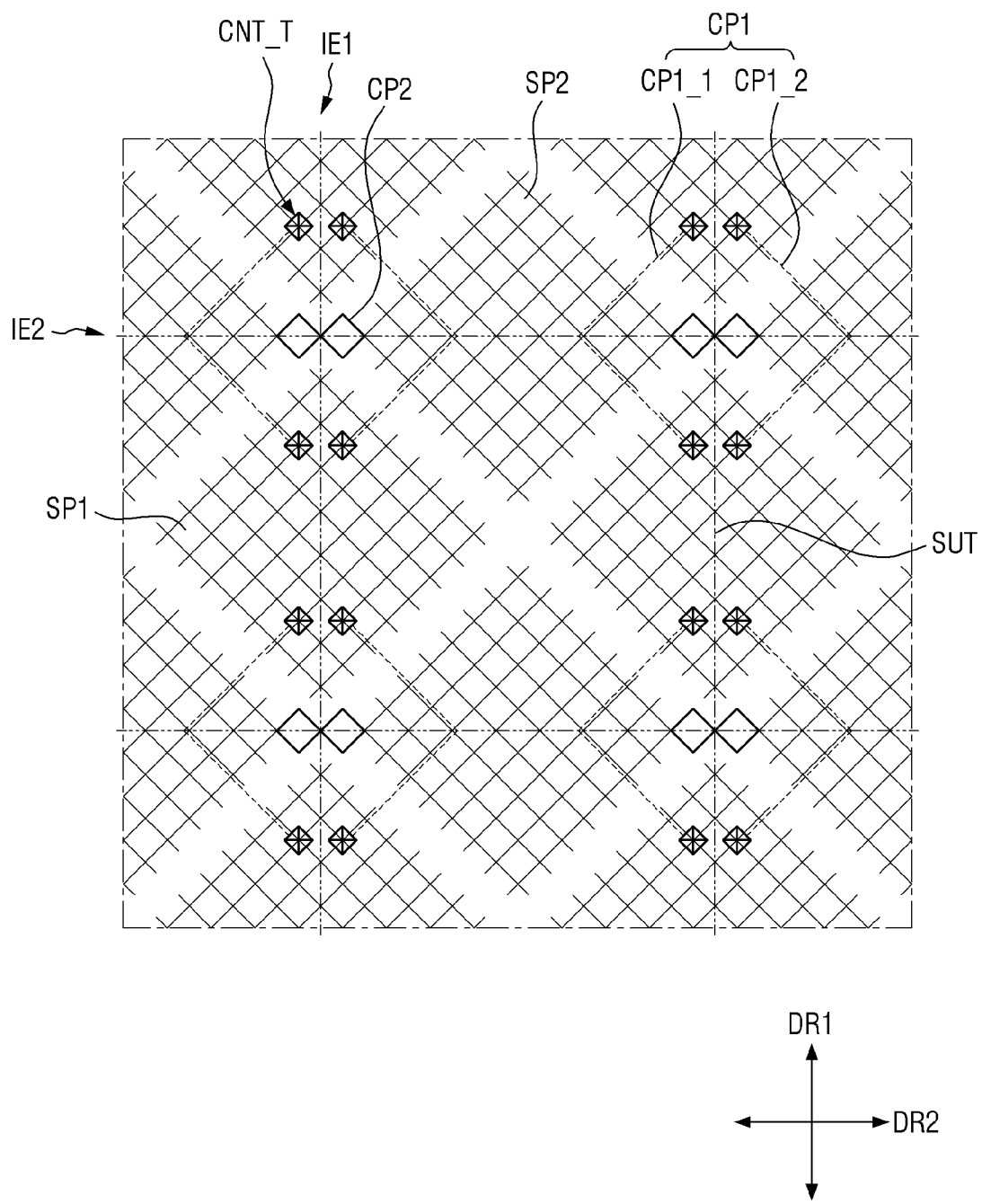
FIG. 5 is a partially enlarged view of a touch area of FIG. 4.
Figure 7:
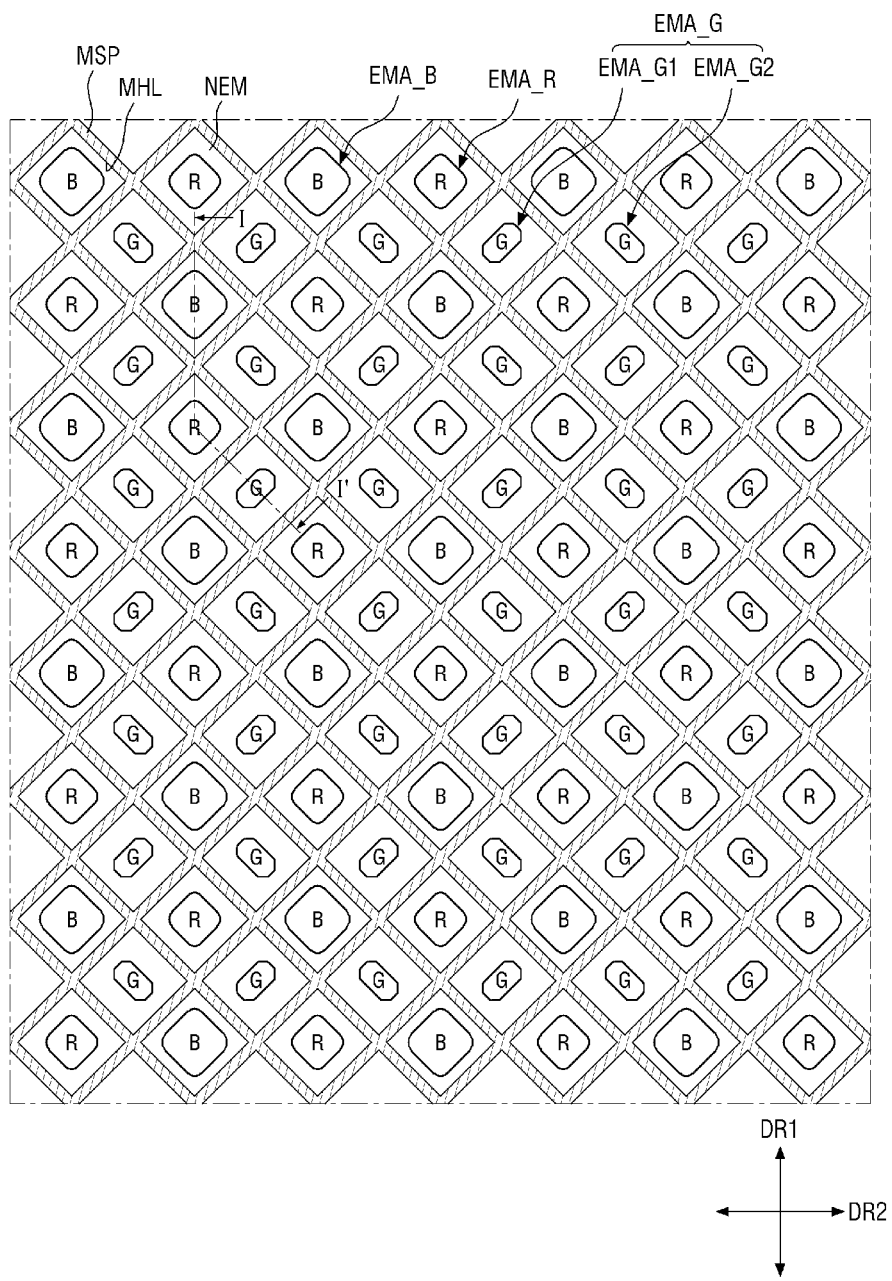
FIG. 7 is a layout view illustrating a relative arrangement relationship between pixels of a display unit and a mesh pattern of a touch member according to one embodiment.

The first sensor portion SP1 of the first sensing electrode IE1 and the second sensor portion SP2 of the second sensing electrode IE2 may each include a planar pattern or a mesh pattern. When the first sensor portion SP1 and the second sensor portion SP2 include a planar pattern, the first sensor portion SP1 and the second sensor portion SP2 may be formed of a transparent conductive layer. When the first sensor portion SP1 and the second sensor portion SP2 include a mesh pattern disposed along a non-emission area as illustrated in FIGS. 5 and 7, even if an opaque low-resistance metal is applied, they may not interfere with the travel of the emitted light. Hereinafter, a case where the first sensor portion SP1 and the second sensor portion SP2 each includes a mesh pattern will be described as an example, but the present disclosure is not limited thereto.

The first connection portion CP1 may connect the corner parts of the adjacent rhombic or triangular first sensor portions SP1 to each other. The second connection portion CP2 may connect the corner parts of the adjacent rhombic or triangular second sensor portions SP2 to each other. The widths of the first connection portion CP1 and the second connection portion CP2 may be smaller than the widths of the first sensor portion SP1 and the second sensor portion SP2.

The first sensing electrode IE1 and the second sensing electrode IE2 may intersect each other while being insulated. Insulation between the first sensing electrode IE1 and the second sensing electrode IE2 may be ensured by being connected through conductive layers positioned on different layers in the intersecting region. Insulation and intersection between the first sensing electrode IE1 and the second sensing electrode IE2 may be achieved by the first connection portion CP1 and/or the second connection portion CP2. For the insulation and intersection, at least one of the first connection portion CP1 or the second connection portion CP2 may be positioned on a different layer from the first sensing electrode IE1 and the second sensing electrode IE2.

As one example, the first sensor portion SP1 of the first sensing electrode IE1 and the second sensor portion SP2 of the second sensing electrode IE2 are formed of a conductive layer positioned on the same layer, and the first sensor portion SP1 and the second sensor portion SP2 themselves may not intersect or overlap each other in a plan view. The first sensor portion SP1 and the second sensor portion SP2 adjacent to each other may be physically spaced apart from each other.

The second connection portion CP2 may be formed of the same conductive layer as that of the second sensor portion SP2 to connect the adjacent second sensor portions SP2. The adjacent first sensor portions SP1 of the first sensing electrode IE1 are physically spaced apart from each other with respect to a region through which the second connection portion CP2 passes. The first connection portion CP1 that connects the first sensor portions SP1 may be formed of a conductive layer different from that of the first sensor portion SP1 and may cross the area of the second sensing electrode IE2. The first connection portion CP1 may be electrically connected to each first sensor portion SP1 adjacent thereto through a contact.

A plurality of first connection portions CP1 may be provided. For example, although not limited to the following, the first connection portion CP1 may include one first connection portion CP1_1 passing by the second sensing electrode IE2 on one side adjacent thereto while overlapping it, and another first connection portion CP1_2 passing by the second sensing electrode IE2 on the other side adjacent thereto while overlapping it in a plan view. When a plurality of first connection portions CP1 connecting two adjacent first sensor portions SP1 are provided, even if any one of them is disconnected due to static electricity or the like, the corresponding first sensing electrode IE1 may be prevented from being disconnected.

The first sensor portions SP1 and the second sensor portions SP2 adjacent to each other may constitute a unit sensing area SUT (see FIG. 5). For example, half of two adjacent first sensor portions SP1 and half of two adjacent second sensor portions SP2 with respect to a region where the first sensing electrode IE1 and the second sensing electrode IE2 intersect may constitute a single square or rectangle. As described above, an area defined by the half areas of the two adjacent first and second sensor portions SP1 and SP2 may be one unit sensing area SUT. A plurality of unit sensing areas SUT may be arranged in a matrix.

In each unit sensing area SUT, by measuring the capacitance value between the adjacent first and second sensor portions SP1 and SP2, it is possible to determine whether or not a touch is inputted and to calculate the corresponding position as touch input coordinates. The touch sensing may be performed in a mutual cap method, but is not limited thereto. Hereinafter, a case where the touch sensing is performed in the mutual cap method will be mainly described.

Each unit sensing area SUT may be larger in size than a pixel. For example, the unit sensing area SUT may correspond to a plurality of pixels. The length of one side of the unit sensing area SUT may be in the range of 4 to 5 mm, but is not limited thereto.

A plurality of touch signal lines are disposed in the non-active region NAR outside the touch area. The touch signal line may extend from touch pad portions TPA1 and TPA2 positioned in the sub-region SR to the non-active region NAR of the main region MR via the bending region BR.

The plurality of touch signal lines may include a plurality of touch driving lines Tx and a plurality of touch sensing lines Rx.

The touch driving line Tx is connected to the first sensing electrode TEL In one embodiment, the plurality of touch driving lines may be connected to one first sensing electrode TEL For example, the touch driving line may include first touch driving lines Tx1_1, Tx2_1, Tx3_1, and Tx4_1 connected to the lower end of the first sensing electrode IE1, and second touch driving lines Tx1_2, Tx2_2, Tx3_2, and Tx4_2 connected to the upper end of the first sensing electrode TEL The first touch driving lines Tx1_1, Tx2_1, Tx3_1, and Tx4_1 may extend from the touch pad portion TPA1 to one side in the first direction DR1 to be connected to the lower end of the first sensing electrode TEL The second touch driving lines Tx1_2, Tx2_2, Tx3_2, and Tx4_2 may extend from the touch pad portion TPA1 to one side in the first direction DR1, and bypass the left edge of the touch area to be connected to the upper end of the first sensing electrode TEL The touch sensing line Rx is connected to the second sensing electrode IE2. In one embodiment, one touch sensing line Rx may be connected to one second sensing electrode IE2. Each of the touch sensing lines Rx1, Rx2, Rx3, Rx4, Rx5, and Rx6 may extend from the touch pad portion TPA2 to one side in the first direction DR1, and extend toward the right edge side of the touch area to be connected to the right end of the second sensing electrode IE2.

Figure 6:
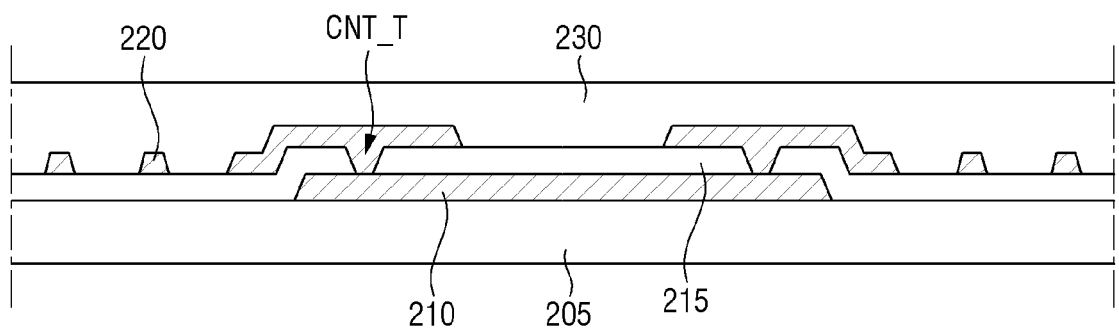
FIG. 6 is a cross-sectional view of an area including the contact hole between the first touch conductive layer and the second touch conductive layer of FIG. 5.

FIG. 5 is a partially enlarged view of a touch area of FIG. 4. FIG. 6 is a cross-sectional view of an area including the contact hole between the first touch conductive layer and the second touch conductive layer of FIG. 5.

Referring to FIGS. 4 to 6, the touch member may include a base layer 205, a first touch conductive layer 210 on the base layer 205, a first touch insulating layer 215 on the first touch conductive layer 210, a second touch conductive layer 220 on the first touch insulating layer 215, and a second touch insulating layer 230 covering the second touch conductive layer 220.

Specifically, the first touch conductive layer 210 is disposed on the base layer 205. The first touch conductive layer 210 is covered with the first touch insulating layer 215. The first touch insulating layer 215 insulates the first touch conductive layer 210 from the second touch conductive layer 220. The second touch conductive layer 220 is disposed on the first touch insulating layer 215. The second touch insulating layer 230 may cover the second touch conductive layer 220 to protect it.

The base layer 205 may include an inorganic insulating material. For example, the base layer 205 may include a silicon nitride layer, a silicon oxynitride layer, a silicon oxide layer, a titanium oxide layer, an aluminum oxide layer, or the like. In some embodiments, the base layer 205 may be replaced with a second inorganic layer 193 constituting a thin film encapsulation layer to be described later.

Each of the first touch conductive layer 210 and the second touch conductive layer 220 may include a metal or a transparent conductive layer. The metal may include aluminum, titanium, copper, molybdenum, silver, or an alloy thereof. The transparent conductive layer may include transparent conductive oxide such as indium tin oxide ("ITO"), indium zinc oxide ("IZO"), zinc oxide (ZnO), or indium tin zinc oxide ("ITZO"), a conductive polymer such as poly ethylenedioxythiophene ("PEDOT"), metal nanowires, graphene, or the like. As described above, when the first touch conductive layer 210 and the second touch conductive layer 220 are disposed on the non-emission area, even if they are made of a low-resistance opaque metal, they may not interfere with the travel of the emitted light.

The first touch conductive layer 210 and/or the second touch conductive layer 220 may include a conductive layer having a multilayer structure. For example, the first touch conductive layer 210 and/or the second touch conductive layer 220 may have a three-layer structure of titanium/aluminum/titanium.

In one embodiment, the above-described first connection portion CP1 may be formed of the first touch conductive layer 210, and the first sensor portion SP1, the second sensor portion SP2, and the second connection portion CP2 may be formed of the second touch conductive layer 220. However, the present disclosure is not limited thereto. Unlike the illustrated example, the first connection portion CP1 may be formed of the second touch conductive layer 220, and the sensor portions SP1 and SP2 and the second connection portion CP2 may be formed of the first touch conductive layer 210 in another embodiment. The touch signal line may be formed of the first touch conductive layer 210 or the second touch conductive layer 220, or may be formed of the first touch conductive layer 210 and the second touch conductive layer 220 connected by a contact. In addition, the touch conductive layer constituting each member of the sensing electrode or the signal line may be variously modified.

The first touch insulating layer 215 and the second touch insulating layer 230 may include an inorganic material or an organic material. In one embodiment, one of the first touch insulating layer 215 and the second touch insulating layer 230 may include an inorganic material, and the other may include an organic material. In one embodiment, the first touch insulating layer 215 may include a silicon nitride layer, a silicon oxynitride layer, a silicon oxide layer, a titanium oxide layer, or an aluminum oxide layer, and the second touch insulating layer 230 may include at least one of acrylic resin, methacrylic resin, polyisoprene, vinyl resin, epoxy resin, urethane resin, cellulose resin, siloxane resin, polyimide resin, polyamide resin, or perylene resin.

The first touch insulating layer 215 may define a contact hole CNT_T therein. The first touch conductive layer 210 (e.g., the first connection portion CP1) and a part of the second touch conductive layer 220 (e.g., the first sensor portion SP1) may be electrically connected through the contact hole CNT_T.

FIG. 7 is a layout view illustrating a relative arrangement relationship between pixels of a display unit and a mesh pattern of a touch member according to one embodiment.

Referring to FIG. 7, the display area of the active region AAR includes a plurality of pixels. Each pixel includes emission areas EMA_R, EMA_G, and EMA_B. The emission areas EMA_R, EMA_G, and EMA_B may overlap the openings of a bank layer 126 (see FIG. 8) in a plan view, and may be defined by them. A non-emission area NEM is disposed between the emission areas EMA_R, EMA_G, and EMA_B of each pixel. The non-emission area NEM may overlap the bank layer 126 in a plan view, and may be defined by it. The non-emission area NEM may surround the emission areas EMA_R, EMA_G, and EMA_B. The non-emission area NEM has a grid shape or a mesh shape disposed along a diagonal direction crossing the first direction DR1 and the second direction DR2 in a plan view. The mesh pattern MSP is disposed in the non-emission area NEM.

The pixel may include a first color pixel (e.g., red pixel), a second color pixel (e.g., blue pixel), and a third color pixel (e.g., green pixel). The emission areas EMA_R, EMA_G, and EMA_B of each color pixel may substantially have a shape of an octagon, or a quadrangle or rhombus with rounded corners. However, the present disclosure is not limited thereto, and each of the emission areas EMA_R, EMA_G, and EMA_B may have a shape of a circle, other polygons, a polygon with rounded corners, or the like in another embodiment.

In one embodiment, the shape of the emission area EMA_R of the first color pixel and the shape of the emission area EMA_B of the second color pixel may be similar to each other in a rhombic shape with rounded corners. The emission area EMA_B of the second color pixel may be larger than the emission area EMA_R of the first color pixel.

The emission area EMA_G of the third color pixel may be smaller than the emission area EMA_R of the first color pixel. The emission area EMA_G of the third color pixel may be inclined in a diagonal direction and may have an octagonal shape having a maximum width in the inclined direction. The emission area EMA_G1 may be inclined in a first diagonal direction, and the emission area EMA_G2 may be inclined in a second diagonal direction.

The emission areas EMA_R, EMA_G, and EMA_B of each color pixel may be arranged in various manners. In one embodiment, the emission area EMA_R of the first color pixel and the emission area EMA_B of the second color pixel may be alternately arranged along the second direction DR2 to form a first row, and the emission area EMA_G (EMA_G1 and EMA_G2) of the third color pixel may be arranged along the second direction DR2 in a second row adjacent thereto. The emission areas EMA_G: EMA_G1 and EMA_G2 of the third color pixel in the second row may be misaligned in the second direction DR2 with respect to the emission areas EMA_R and EMA_B of the pixel in the first row. In the second row, the emission area EMA_G1 of the third color pixel inclined in the first diagonal direction and the emission area EMA_G2 of the third color pixel inclined in the second diagonal direction may be alternately arranged along the second direction DR2.

The third row and the first row have the same arrangement of the emission areas EMA_R and EMA_B, but the arrangement order may be reversed. That is, the emission area EMA_B of the second color pixel may be disposed in the third row belonging to the same column as the emission area EMA_R of the first color pixel in the first row, and the emission area EMA_R of the first color pixel may be disposed in the third row belonging to the same column as the emission area EMA_B of the second color pixel in the first row. Similarly to the second row, a fourth row may have the arrangement of the emission areas EMA_G1 and EMA_G2 of the third color pixel, but the arrangement order may be reversed from the perspective of the diagonally inclined shape. That is, the emission area EMA_G2 of the third color pixel inclined in the second diagonal direction may be disposed in the fourth row belonging to the same column as the emission area EMA_G1 of the third color pixel inclined in the first diagonal direction in the second row, and the emission area EMA_G1 of the third color pixel inclined in the first diagonal direction may be disposed in the fourth row belonging to the same column as the emission area EMA_G2 of the third color pixel inclined in the second diagonal direction in the second row.

The arrangement of the first to fourth rows may be repeated along the first direction DR1. However, the arrangement of the emission areas EMA_R. EMA_B and EMA_G is not limited to the above example.

The mesh pattern MSP may be disposed along the boundary of the pixel in the non-emission area NEM. The mesh pattern MSP may not overlap the emission areas EMA_R, EMA_G, and EMA_B in a plan view. The mesh pattern MSP may be located in the non-emission area NEM in a plan view. In one embodiment, a mesh hole MHL exposed by the mesh pattern MSP may have a substantially rhombic shape. The size of each mesh hole MHL may be the same, but may be different depending on the size of the emission area EMA_R, EMA_G, EMA_B exposed by the corresponding mesh hole MHL, or may be different regardless thereof. In the drawing, a case where one mesh hole MHL corresponds to one emission area EMA_R, EMA_G, EMA_B is exemplified, but the present disclosure is not limited thereto, and one mesh hole MHL may correspond to two or more of the emission areas EMA_R, EMA_G, and EMA_B in another embodiment.

Figure 8:
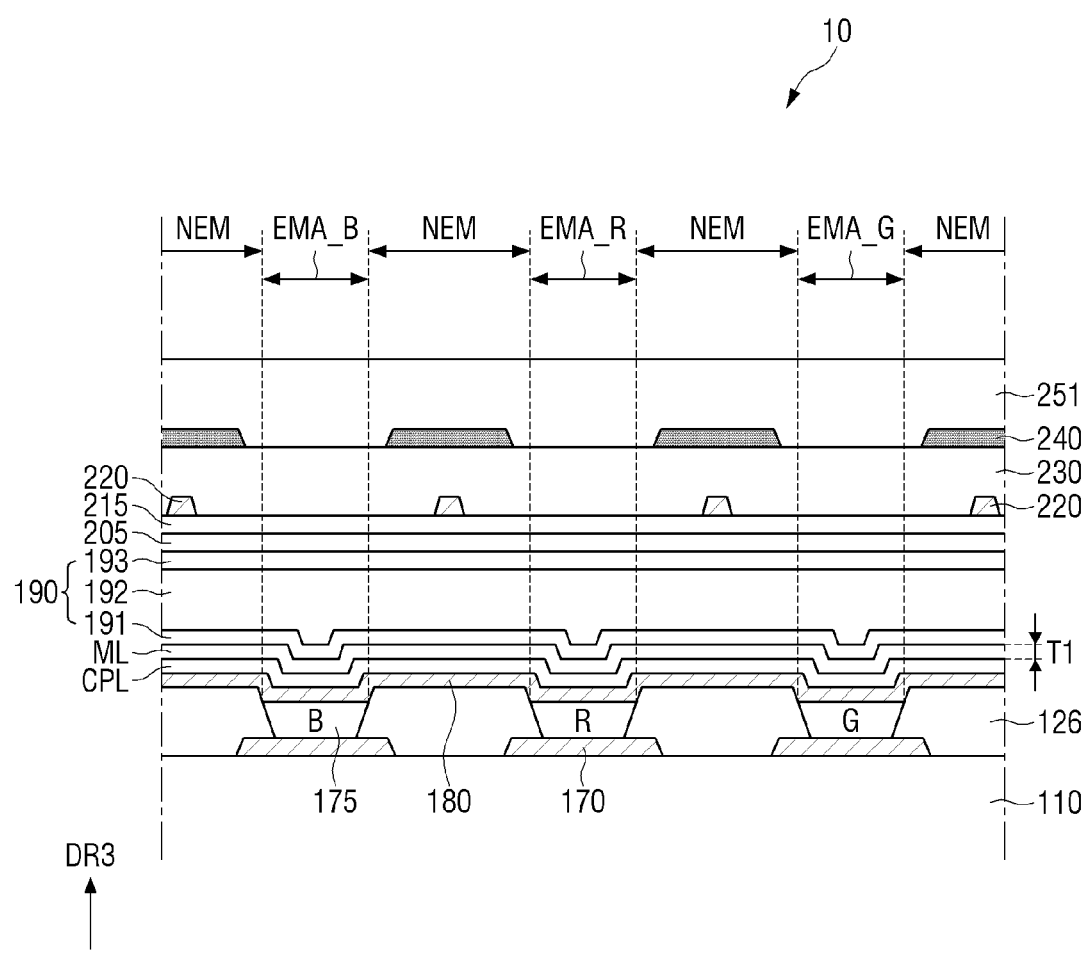
FIG. 8 is a cross-sectional view taken along line I-I' of FIG. 7.
Figure 9:
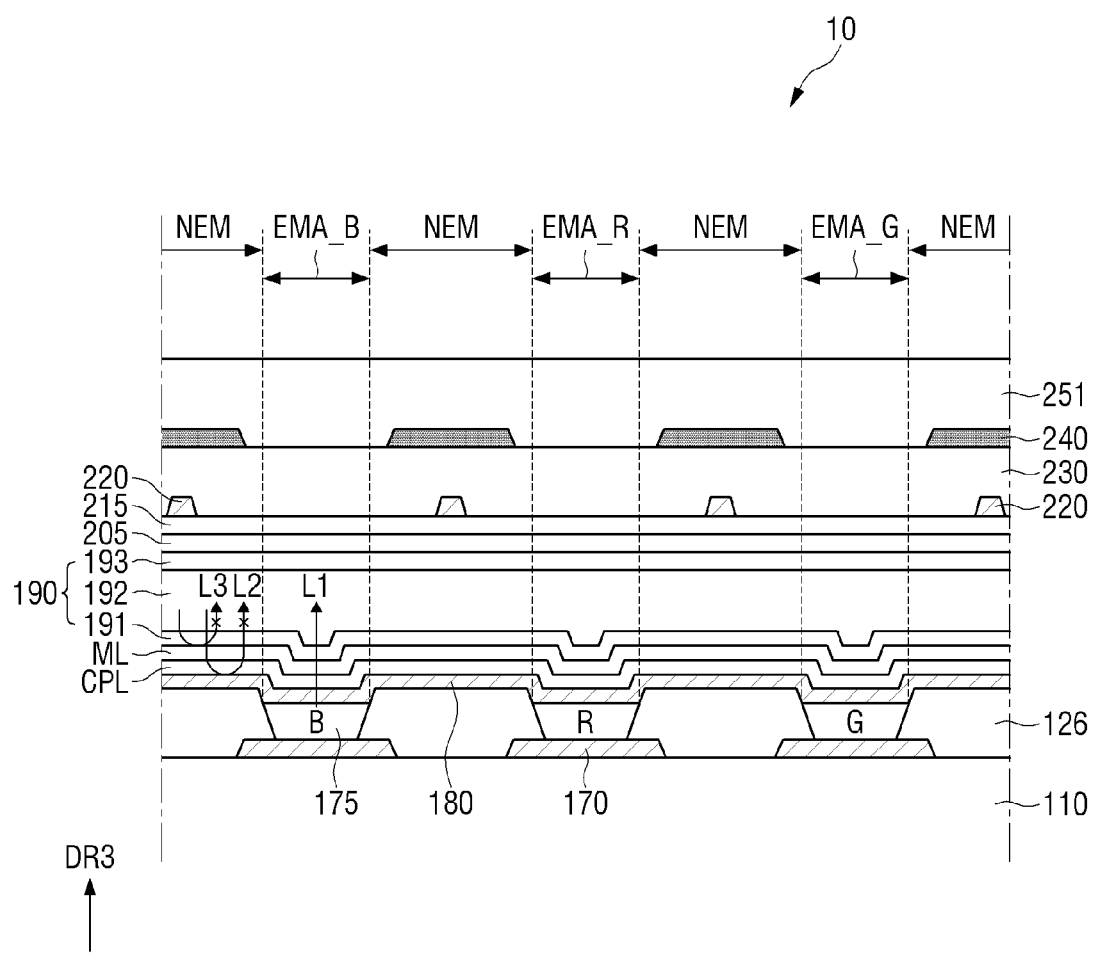
FIG. 9 is a schematic diagram showing that light reflected by the cathode electrode of FIG. 8 and light reflected by an inorganic deposition layer are mutually canceled out.

FIG. 8 is a cross-sectional view taken along line I-I' of FIG. 7. FIG. 9 is a schematic diagram showing that light reflected by the cathode electrode of FIG. 8 and light reflected by an inorganic deposition layer are mutually canceled out. In the cross-sectional view of FIG. 8 and the schematic diagram of FIG. 9, most of the layers under an anode electrode 170 are omitted, and the upper structure of an organic light emitting element is mainly illustrated. The organic light emitting element includes the anode electrode 170, a light emitting layer, and a cathode electrode 180.

Referring to FIGS. 8 and 9, the substrate 110 of the display device 1 may be made of an insulating material such as a polymer resin or the like. Examples of the polymer material may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("TAC"), cellulose acetate propionate ("CAP"), or a combination thereof. The substrate 110 may be a flexible substrate which can be bent, folded or rolled. An example of the material of the flexible substrate may be polyimide (PI), but is not limited thereto.

The anode electrode 170 is disposed on the substrate 110. Although a case where the anode electrode 170 is disposed directly on the substrate 110 is illustrated in the drawing for simplicity of description, the circuit driving layer DRL including a plurality of thin film transistors and a signal line may be disposed between the substrate 110 and the anode electrode 170 (See FIG. 3).

The anode electrode 170 may be a pixel electrode disposed for each pixel. The anode electrode 170 may have a stacked structure formed by stacking a material layer having a high work function, such as indium tin oxide (ITO), indium zinc oxide (IZO), zinc oxide (ZnO) and indium oxide (In$_2$O$_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The layer having a high work function may be disposed above the reflective material layer and disposed closer to an organic layer 175. The anode electrode 170 may have a multilayer structure such as ITO/Mg, ITO/MgF, ITO/Ag and ITO/Ag/ITO, but is not limited thereto.

The bank layer 126 may be disposed on the substrate 110. The bank layer 126 may be disposed on the anode electrode 170 and may define an opening exposing the anode electrode 170. The emission areas EMA_R, EMA_G, and EMA_B and the non-emission area NEM may be separated by the bank layer 126 and the openings thereof. The bank layer 126 may include an organic insulating material such as acrylic resin, epoxy resin, phenolic resin, polyamide resin, polyimide resin, unsaturated polyester resin, polyphenylene resin, polyphenylenesulfide resin or benzocyclobutene ("BCB"). The bank layer 126 may also include an inorganic material.

The light emitting layer is disposed on the anode electrode 170 exposed by the bank layer 126. The light emitting layer may include the organic layer 175. The organic layer 175 may include an organic light emitting layer, and may further include a hole injecting/transporting layer and/or an electron injecting/transporting layer. The first light may be emitted from the organic layer 175 in an upward direction. The first light may be blue light, green light, or red light.

The cathode electrode 180 may be disposed on the organic layer 175. The cathode electrode 180 may be a common electrode extended across all the pixels. The anode electrode 170, the organic layer 175, and the cathode electrode 180 may constitute an organic light emitting element.

The cathode electrode 180 may be in contact with the top surface of the bank layer 126 as well as the organic layer 175. The cathode electrode 180 may be formed to be conformal to a structure disposed therebelow to reflect a stepped portion of the structure disposed therebelow.

The cathode electrode 180 may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode 180 may further include a transparent metal oxide layer disposed on the material layer having a low work function.

A capping layer CPL may be disposed on the cathode electrode 180. For example, the capping layer CPL may include lithium fluoride (LiF), an inorganic insulating material, or an organic insulating material. The capping layer CPL may serve to cover and protect the above-described cathode electrode 180 from the top thereof. Although FIG. 8 shows that the capping layer CPL is formed as a single layer, the present disclosure is not limited thereto and the capping layer CPL and may be formed as a plurality of stacked layers in another embodiment. Each of the plurality of stacked layers may be made of a material selected from the lithium fluoride (LiF), the inorganic insulating material, or the organic insulating material.

For example, the capping layer CPL may include an inorganic insulating material. For example, the capping layer CPL may include one or more inorganic insulating materials selected from the group consisting of aluminum oxide, titanium oxide, tantalum oxide, hafnium oxide, zinc oxide, silicon oxide, silicon nitride and silicon oxynitride. The materials of the plurality of stacked films of the capping layer CPL may be different from each other, but may be the same.

An inorganic deposition layer ML may be disposed on the capping layer CPL. The inorganic deposition layer ML serves to cancel out external light reflected by the cathode electrode 180. As shown in FIG. 9, external light L2 incident from the upper side of the display panel 10 may be reflected by the cathode electrode 180, and a part of the external light L2 reflected by the cathode electrode 180 may be visually recognized by a user. However, in the display panel 10 according to one embodiment, the inorganic deposition layer ML is disposed on the cathode electrode 180, and the external light L2 reflected by the cathode electrode 180 is mutually canceled out by external light L3 reflected by the inorganic deposition layer ML, which makes it possible to effectively prevent the external light from being visually recognized by a user. The inorganic deposition layer ML has a first thickness T1 in the thickness direction DR3. The first thickness T1 may be about 500 nm to about 1700 nm. When the first thickness T1 is about 500 nm or more, the reflection of the external light L3 on the inorganic deposition layer ML effectively occurs, which makes the mutual interference with the external light L2 reflected by the cathode electrode 180 possible. When the first thickness T1 is about 1700 nm or less, it is possible to prevent a decrease in the transmission efficiency of the first light L1 due to the thickness of the inorganic deposition layer ML.

The inorganic deposition layer ML may include an inorganic insulating material. The inorganic insulating material may include a metal. Examples of the metal may include silver (Ag), magnesium (Mg), manganese (Mn), bismuth (Bi), ytterbium (Yb), zinc (Zn), tellurium (Te), selenium (Se), and the like, but the present disclosure is not limited thereto. At a wavelength of about 550 nm, an absorption coefficient k of the inorganic deposition layer ML may be less than 4. For example, the absorption coefficient k of bismuth (Bi) may be 2.86, the absorption coefficient k of ytterbium (Yb) may be 1.58, the absorption coefficient k of tellurium (Te) may be 2.87, and the absorption coefficient k of selenium (Se) may be 0.04. For example, the inorganic deposition layer ML may include ytterbium (Yb) or bismuth (Bi).

A thin film encapsulation layer 190 including a first inorganic layer 191, an organic layer 192, and a second inorganic layer 193 is disposed on the cathode electrode 180. The thin film encapsulation layer 190 may be disposed between the cathode electrode 180 and the base layer 205.

Each of the first inorganic layer 191 and the second inorganic layer 193 may include silicon nitride, silicon oxide, silicon oxynitride, or the like.

The base layer 205, the first touch insulating layer 215, the second touch conductive layer 220, and the second touch insulating layer 230 may be sequentially disposed on the thin film encapsulation layer 190, and redundant description of each layer will be omitted. FIGS. 8 and 9 are cross-sectional views of a sensor portion, so the first touch conductive layer 210 is not illustrated in the corresponding cross-sectional views.

The second touch conductive layer 220 may overlap the bank layer 126 in a plan view, and may be disposed in the non-emission area NEM. The second touch conductive layer 220 forms the mesh pattern MSP of the sensor portion, and does not overlap the emission areas EMA_R, EMA_G, and EMA_B in a plan view. Therefore, it does not disturb emission, and may not be visually recognized by a user.

A light blocking pattern 240 is disposed on the second touch insulating layer 230. The light blocking pattern 240 may serve to reduce reflection of external light and improve a reflection color. The light blocking pattern 240 is disposed in the non-emission area NEM. The light blocking pattern 240 may have a grid shape or a mesh shape in a plan view. The light blocking pattern 240, the touch conductive layers 210 and 220, and the bank layer 126 are disposed in the non-emission area NEM and overlap in the thickness direction DR3. The width of the light blocking pattern 240 may be smaller than or equal to the width of the bank layer 126, and may be greater than the widths of the touch conductive layers 210 and 220. The light blocking pattern 240 may not overlap the emission areas EMA_R, EMA_G, and EMA_B in a plan view.

An anti-reflection layer 251 is disposed on the light blocking pattern 240. The anti-reflection layer 251 may be disposed directly on the light blocking pattern 240. As described with reference to FIG. 3, it may be understood that the light blocking pattern 240 and the anti-reflection layer 251 form an anti-reflection member, and the anti-reflection member is disposed on the second touch insulating layer 230. Since the anti-reflection layer 251 has been described with reference to FIG. 3, a detailed description thereof will be omitted.

Hereinafter, other embodiments will be described.

Figure 10:
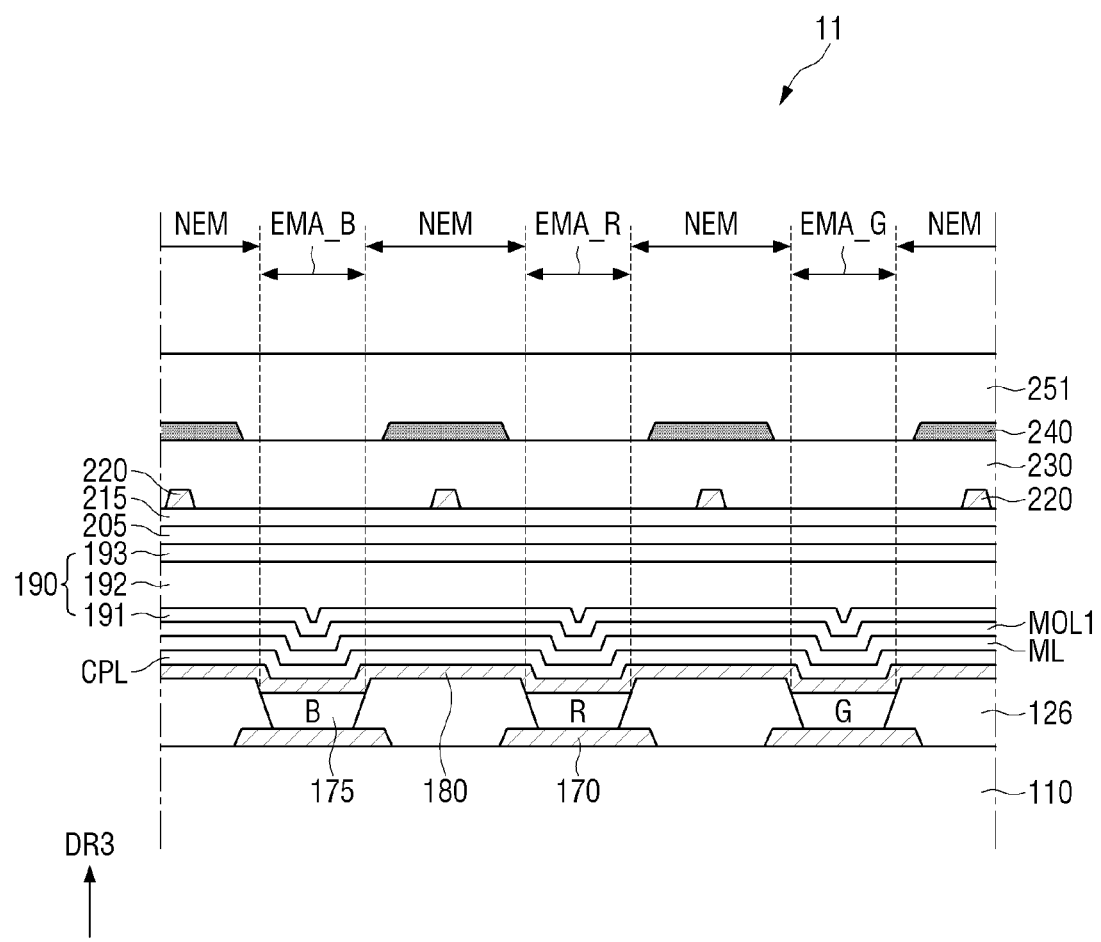
FIG. 10 is a cross-sectional view of a display panel according to another embodiment.

FIG. 10 is a cross-sectional view of a display panel according to another embodiment.

Referring to FIG. 10, a display panel 11 according to the present embodiment is different from the display device of FIG. 8 in that it further includes a first oxide layer MOL1 between the inorganic deposition layer ML and the thin film encapsulation layer 190.

More specifically, the display panel 11 according to the present embodiment may further include the first oxide layer MOL1 between the inorganic deposition layer ML and the thin film encapsulation layer 190. The first oxide layer MOL1 may include a material of the inorganic deposition layer ML and oxygen. The first oxide layer MOL1 may be formed by oxidation of the material of the inorganic deposition layer ML by oxygen atoms of nitrogen ($N_2O$) generated in the process of depositing the inorganic deposition layer ML and then forming the first inorganic layer 191 of the thin film encapsulation layer 190.

Figure 11:
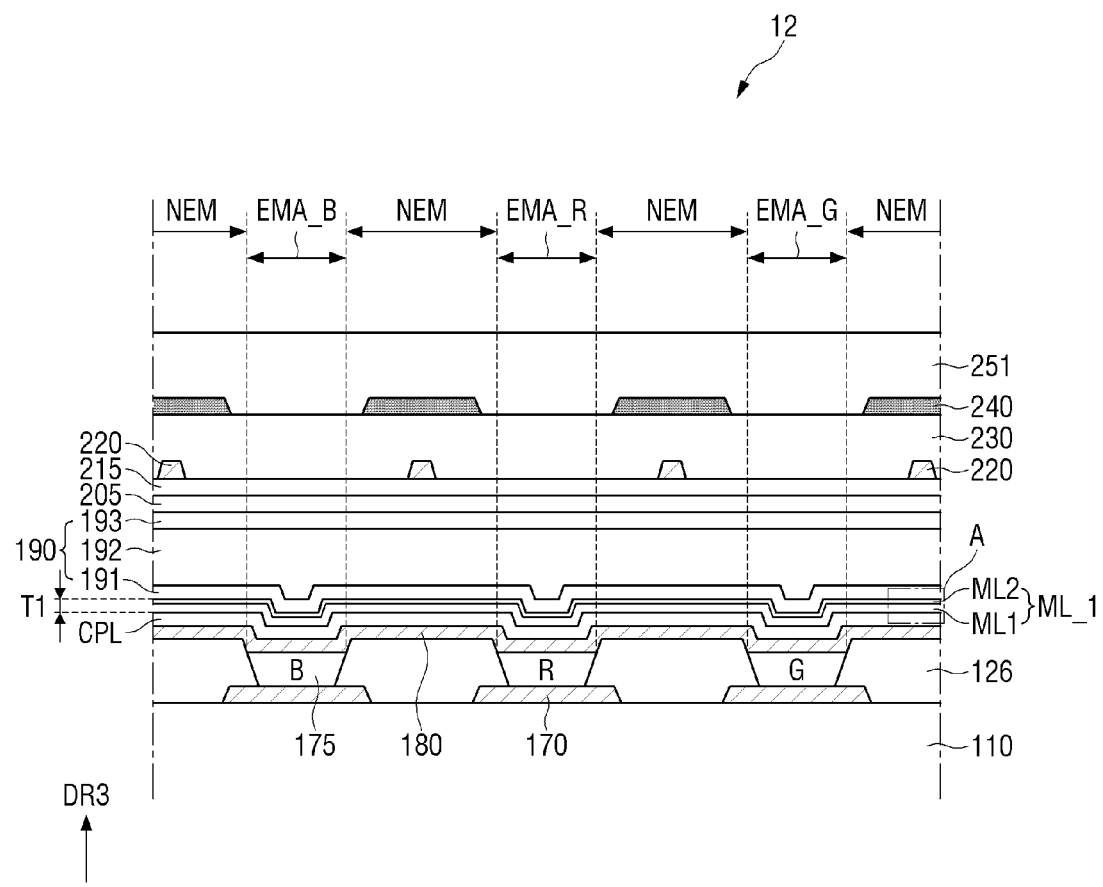
FIG. 11 is a cross-sectional view of a display panel according to still another embodiment.
Figure 12:
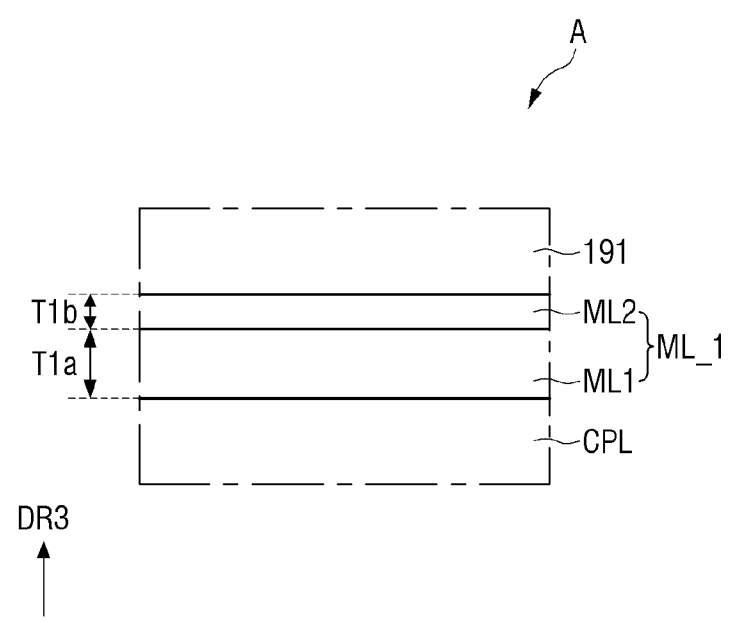
FIG. 12 is an enlarged cross-sectional view of area A of FIG. 11.

FIG. 11 is a cross-sectional view of a display panel according to still another embodiment. FIG. 12 is an enlarged cross-sectional view of area A of FIG. 11.

Referring to FIGS. 11 and 12, a display panel 12 according to the present embodiment is different from the display panel 10 of FIG. 8 in that an inorganic deposition layer ML_1 is formed as two layers.

More specifically, the display panel 12 according to the present embodiment may be formed as two layers in which the inorganic deposition layers ML_1 are stacked. The two stacked inorganic deposition layers ML_1 may include a first inorganic deposition layer ML1 on the capping layer CPL and a second inorganic deposition layer ML2 disposed between the first inorganic layer ML1 and the first inorganic layer 191.

A first thickness T1 of the inorganic deposition layer ML_1 in the thickness direction DR3 may be the same as the first thickness T1 of the inorganic deposition layer ML of FIG. 8. That is, the sum of a thickness T1$a$ of the first inorganic deposition layer ML1 and a thickness T1$b$ of the second inorganic deposition layer ML2 may be the same as the first thickness T1 of the inorganic deposition layer ML. For example, although not limited to the following, the thickness T1$a$ of the first inorganic deposition layer ML1 may be greater than the thickness T1$b$ of the second inorganic deposition layer ML2. For example, the thickness T1$a$ of the first inorganic deposition layer ML1 may be about 400 nm to about 1400 nm, and the thickness T1$b$ of the second inorganic deposition layer ML2 may be about 100 nm to about 300 nm.

In the inorganic deposition layer ML_1 including the first inorganic deposition layer ML1 and the second inorganic deposition layer ML2, as described with reference to FIG. 9, it is possible to suppress user's visual recognition of external light by mutually canceling out the external light L2 reflected by the cathode electrode 180 by the external light L3 reflected by the inorganic deposition layer ML_1. However, when the inorganic deposition layer ML includes only the first inorganic deposition layer ML1, as described with reference to FIG. 10, the first oxide layer MOL1 may be formed between the first inorganic deposition layer ML1 and the thin film encapsulation layer 190. The thickness of the first oxide layer MOL1 may increase as the reducing power (or a desired degree of oxidation) of the inorganic deposition layer disposed directly thereunder increases. When the thickness of the first oxide layer MOL1 increases, the transmission efficiency of the first light L1 emitted from the emission layer shown in FIG. 9 may deteriorate (i.e., decrease). To this end, in the display panel 11 according to the present embodiment, it is possible to minimize the thickness of an oxide layer to be formed by disposing the second inorganic deposition layer ML2 whose reducing power is smaller than the reducing power of the first inorganic deposition layer ML1 on the first inorganic deposition layer ML1.

In other words, the reducing power of the first inorganic deposition layer ML1 may be greater than the reducing power of the second inorganic deposition layer ML2. For example, the first inorganic deposition layer ML1 may include ytterbium (Yb), and the second inorganic deposition layer ML2 may include bismuth (Bi). The first inorganic deposition layer ML1 mainly serves to mutually cancel out the external light L2 reflected by the cathode electrode 180 by the external light L3 reflected by the inorganic deposition layer ML_1, and the second inorganic deposition layer ML2 mainly serves to prevent oxidation of the first inorganic deposition layer ML1 disposed directly thereunder, so that the thickness T$ia$ of the first inorganic deposition layer ML1 may be greater than the thickness T1$b$ of the second inorganic deposition layer ML2 in the third direction DR3, as described above.

Since other descriptions have been made with reference to FIG. 8, detailed descriptions are omitted.

Figure 13:
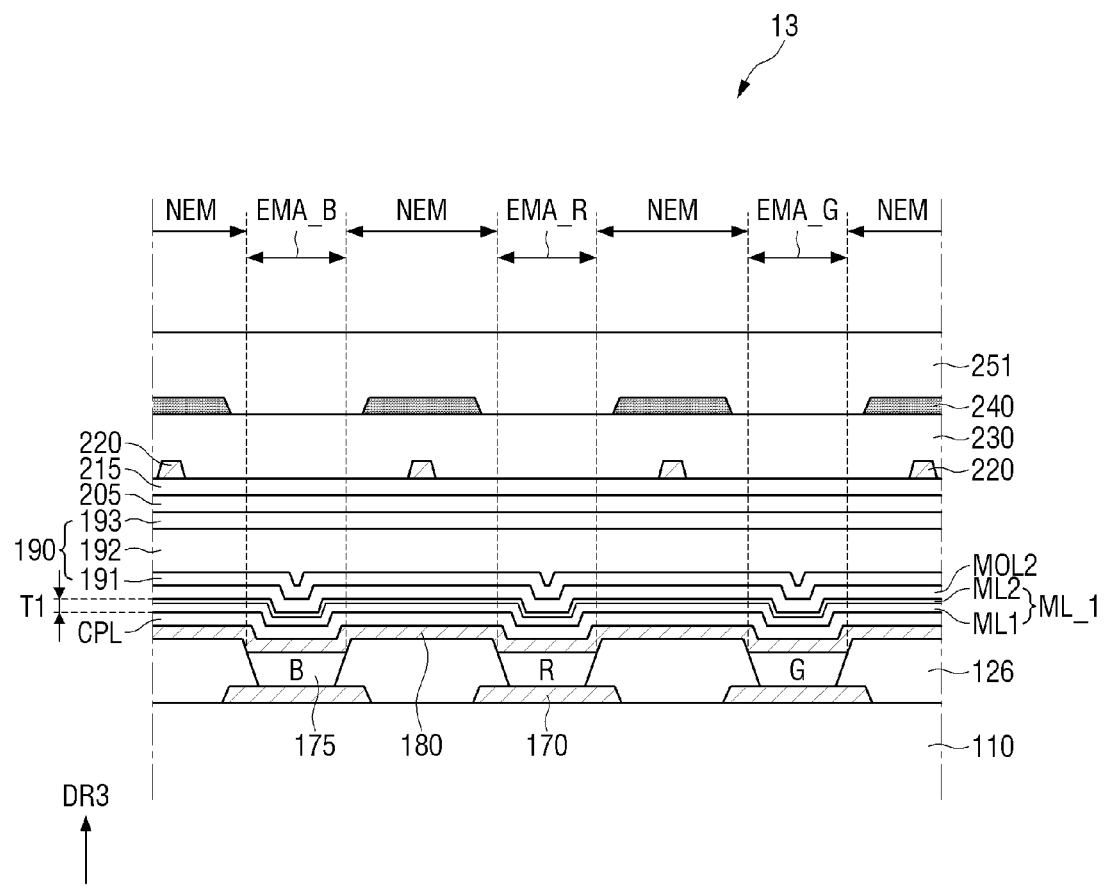
FIG. 13 is a cross-sectional view of a display panel according to still another embodiment.

FIG. 13 is a cross-sectional view of a display panel according to still another embodiment.

Referring to FIG. 13, a display panel 13 according to the present embodiment is different from the display panel 12 of FIG. 12 in that a second oxide layer MOL2 is further disposed between the second inorganic deposition layer ML2 and the thin film encapsulation layer 190.

More specifically, in the display panel 13 according to the present embodiment, the second oxide layer MOL2 may be further disposed between the second inorganic deposition layer ML2 and the thin film encapsulation layer 190.

The second oxide layer MOL2 may include a material of the second inorganic deposition layer ML2 and oxygen. The second oxide layer MOL2 may be formed by oxidation of the material of the second inorganic deposition layer ML2 by oxygen atoms of nitrogen ($N_2O$) generated in the process of depositing the second inorganic deposition layer ML2 and then forming the first inorganic layer 191 of the thin film encapsulation layer 190.

As described in FIG. 12, the reducing power of the first inorganic deposition layer ML1 is greater than the reducing power of the second inorganic deposition layer ML2 (on the contrary, the reducing power of the second inorganic deposition layer ML2 is smaller than the reducing power of the first inorganic deposition layer ML1), so that the thickness of the second oxide layer MOL2 in the third direction DR3 may be smaller than the thickness of the first oxide layer MOL1 of FIG. 10. The thickness of the oxide layer is related to the transmission efficiency (or transmittance) of the first light L1 (see FIG. 9) emitted from the light emitting layer, as described in FIGS. 11 and 12. A detailed description thereof will be given later with reference to FIGS. 14 to 16.

Figure 14:
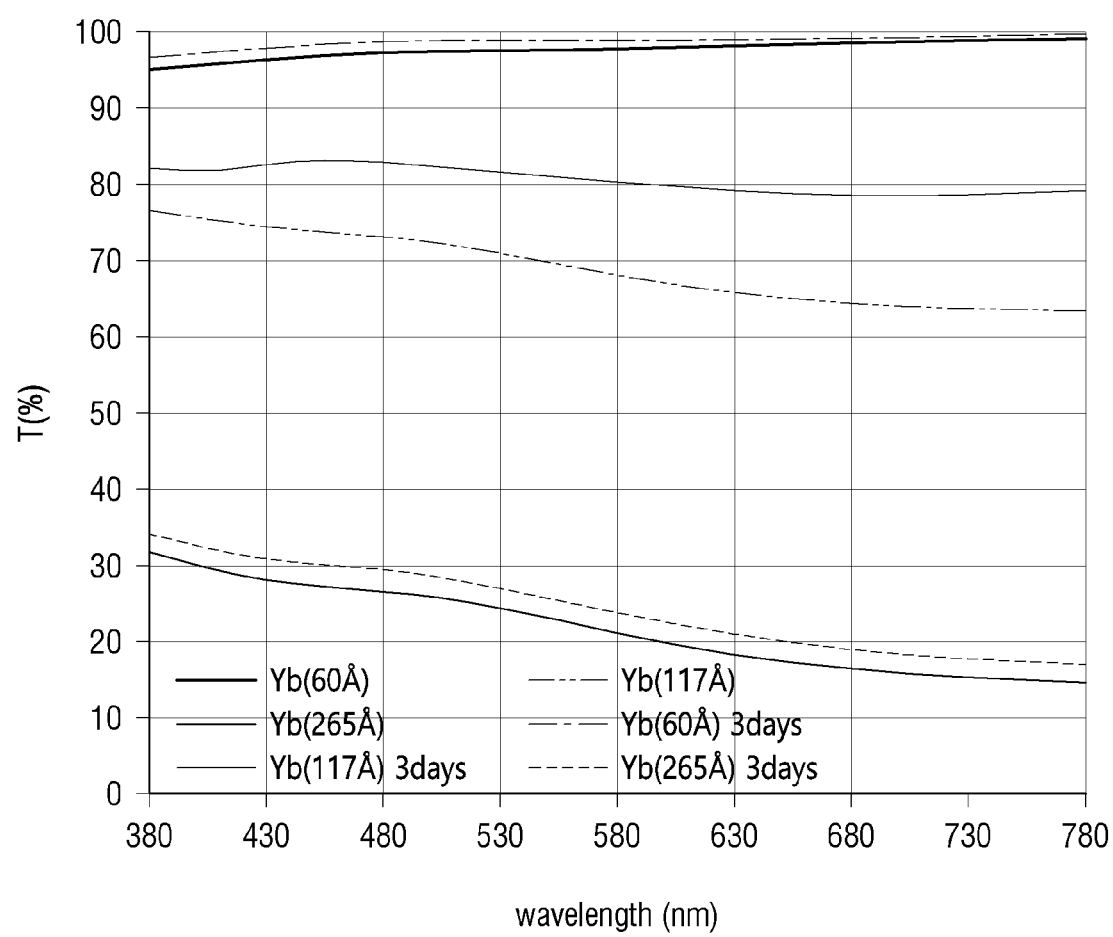
FIG. 14 is a graph showing a transmittance T according to the wavelength of ytterbium (Yb)
Figure 15:
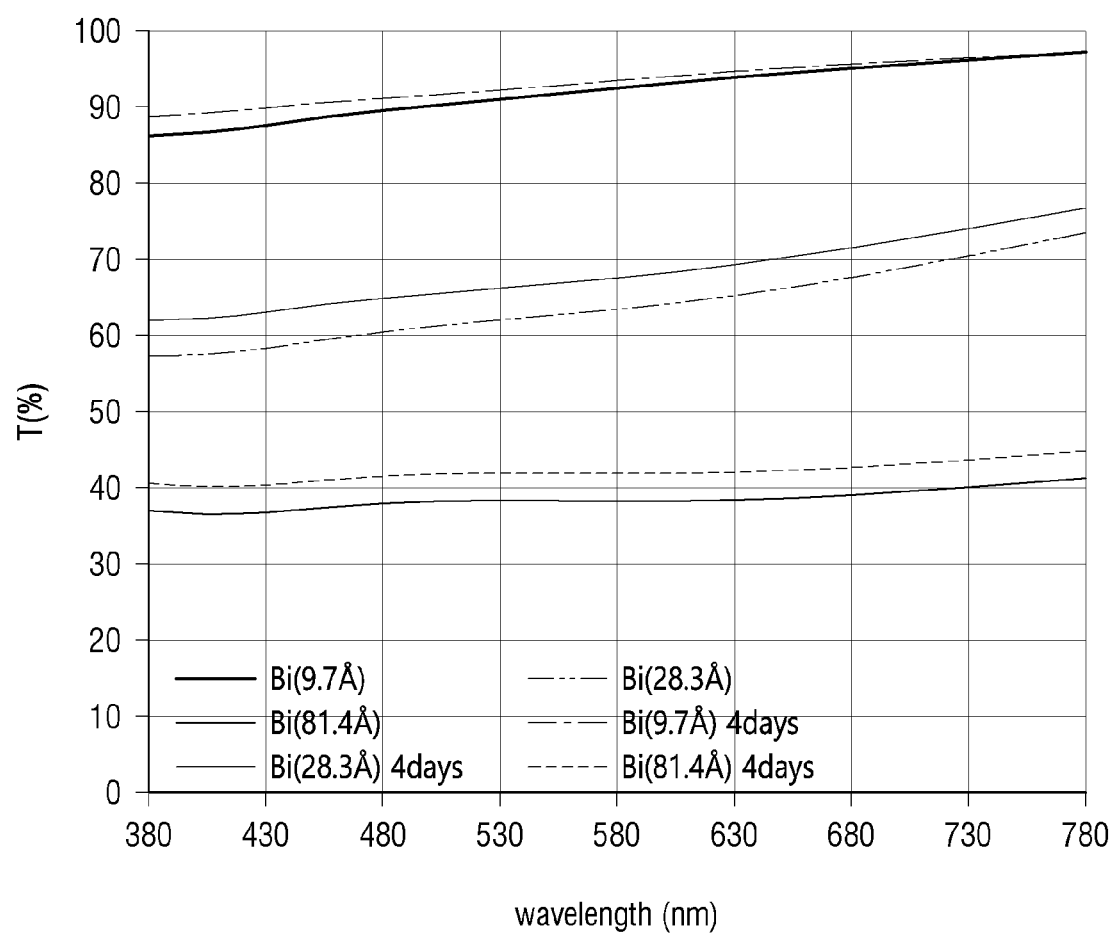
FIG. 15 is a graph showing a transmittance T according to the wavelength of bismuth (Bi)
Figure 16:
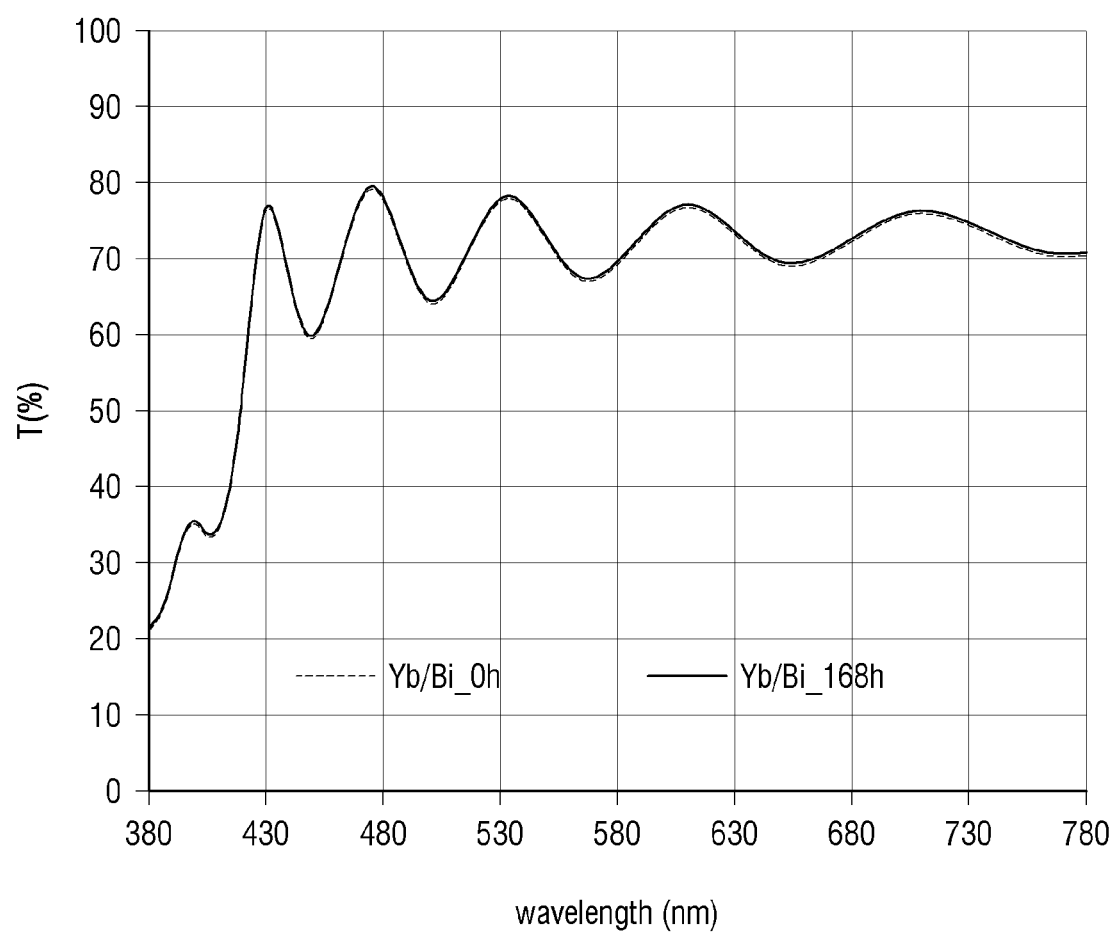
FIG. 16 is a graph showing a transmittance T according to the wavelength of a stacked structure of ytterbium (Yb)/bismuth (Bi)

FIG. 14 is a graph showing a transmittance T according to the wavelength of ytterbium (Yb). FIG. 15 is a graph showing a transmittance T according to the wavelength of bismuth (Bi). FIG. 16 is a graph showing a transmittance T according to the wavelength of a stacked structure of ytterbium (Yb)/bismuth (Bi). In FIG. 14, the horizontal axis indicates a wavelength (nanometers: nm), the vertical axis indicates the transmittance T (percentages: %) of ytterbium (Yb). In FIG. 15, the horizontal axis indicates a wavelength (nm), and the vertical axis indicates the transmittance (%) of bismuth (Bi). In FIG. 16, the horizontal axis indicates a wavelength (nm), and the vertical axis indicates the transmittance (%) of ytterbium (Yb)/bismuth (Bi).

First, referring to FIG. 14, a first sample is a sample in which the transmittance of ytterbium (Yb) having a thickness of about 60 angstroms (Å) was measured immediately after the deposition, the second sample is a sample in which the transmittance of ytterbium (Yb) having a thickness of about 117 Å was measured immediately after the deposition, the third sample is a sample in which the transmittance of ytterbium (Yb) having a thickness of about 265 Å was measured immediately after the deposition, the fourth sample is a sample in which the transmittance of ytterbium (Yb) having a thickness of about 60 Å was measured after 72 hours from the deposition, the fifth sample is a sample in which the transmittance of ytterbium (Yb) having a thickness of about 117 Å was measured after 72 hours from the deposition, and the sixth sample is a sample in which the transmittance of ytterbium (Yb) having a thickness of about 265 Å was measured after 72 hours from the deposition.

In the case of the first sample, it was clear that the transmittance (%) was about 95 to about 100 at a wavelength of about 380 nm to about 780 nm, and the transmittance (%) gradually increased as the wavelength increased.

In the case of the second sample, it was clear that the transmittance (%) was about 60 to 77 at a wavelength of about 380 nm to about 780 nm, and the transmittance (%) gradually decreased as the wavelength increased.

In the case of the third sample, it was clear that the transmittance (%) was about 14 to 35 at a wavelength of about 380 nm to about 780 nm, and the transmittance (%) gradually decreased as the wavelength increased.

In the case of the fourth sample, it was clear that the transmittance (%) was about 95 to about 100 at a wavelength of about 380 nm to about 780 nm, and the transmittance (%) gradually increased as the wavelength increased. It was clear that the transition of the transmittance (%) according to the wavelength of the fourth sample is substantially the same as the transition of the transmittance (%) according to the wavelength of the first sample.

In the case of the fifth sample, it was clear that the transmittance (%) was about 78 to 85 at a wavelength of about 380 nm to about 780 nm, and the transmittance (%) approximately increased and decreased repeatedly as the wavelength increased. It was clear that there was a difference of about 4% to 20% between the transmittance of the second sample and the transmittance of the fifth sample depending on the wavelength.

In the case of the sixth sample, it was clear that the transmittance (%) was about 18 to 35 at a wavelength of about 380 nm to about 780 nm, and the transmittance (%) gradually decreased as the wavelength increased. It was clear that the transition of the transmittance (%) according to the wavelength of the sixth sample is substantially the same as the transition of the transmittance (%) according to the wavelength of the third sample.

Next, referring to FIG. 15, a seventh sample is a sample in which the transmittance of bismuth (Bi) having a thickness of about 9.7 Å was measured immediately after the deposition, an eighth sample is a sample in which the transmittance of bismuth (Bi) having a thickness of about 28.3 Å was measured immediately after the deposition, a ninth sample is a sample in which the transmittance of bismuth (Bi) having a thickness of about 81.4 Å was measured immediately after the deposition, a tenth sample is a sample in which the transmittance of bismuth (Bi) having a thickness of about 9.7 Å was measured after 72 hours from the deposition, an eleventh sample is a sample in which the transmittance of bismuth (Bi) having a thickness of about 28.3 Å was measured after 72 hours from the deposition, and a twelfth sample is a sample in which the transmittance of bismuth (Bi) having a thickness of about 81.4 Å was measured after 72 hours from the deposition.

In the case of the seventh sample, it was clear that the transmittance (%) was about 85 to about 100 at a wavelength of about 380 nm to about 780 nm, and the transmittance (%) gradually increased as the wavelength increased.

In the case of the eighth sample, it was clear that the transmittance (%) was about 55 to 75 at a wavelength of about 380 nm to about 780 nm, and the transmittance (%) gradually increased as the wavelength increased.

In the case of the ninth sample, it was clear that the transmittance (%) was about 35 to 43 at a wavelength of about 380 nm to about 780 nm.

In the case of the tenth sample, it was clear that the transmittance (%) was about 88 to about 100 at a wavelength of about 380 nm to about 780 nm, and the transmittance (%) gradually increased as the wavelength increased. It was clear that the transition of the transmittance (%) according to the wavelength of the tenth sample is substantially the same as the transition of the transmittance (%) according to the wavelength of the seventh sample.

In the case of the eleventh sample, it was clear that the transmittance (%) was about 60 to 78 at a wavelength of about 380 nm to about 780 nm, and the transmittance (%) gradually increased as the wavelength increased. It was clear that the transition of the transmittance (%) according to the wavelength of the eleventh sample is substantially the same as the transition of the transmittance (%) according to the wavelength of the eighth sample. It was clear that there was a difference of about 5% or less between the transmittance of the eighth sample and the transmittance of the eleventh sample depending on the wavelength.

In the case of the twelfth sample, it was clear that the transmittance (%) was about 40 to 45 at a wavelength of about 380 nm to about 780 nm. It was clear that the transition of the transmittance (%) according to the wavelength of the twelfth sample is substantially the same as the transition of the transmittance (%) according to the wavelength of the ninth sample.

Next, referring to FIG. 16, a thirteenth sample is a sample in which bismuth (Bi) having a thickness of about 28.3 Å was deposited directly on ytterbium (Yb) having a thickness of is about 117 Å and the transmittance was measured immediately after the deposition, and a fourteenth sample is a sample in which bismuth (Bi) having a thickness of about 28.3 Å was deposited directly on ytterbium (Yb) having a thickness of about 117 Å and the transmittance was measured after 168 hours from the deposition.

As described in FIG. 14, there is a difference of up to 20% between the transmittance of the second sample and the transmittance of the fifth sample depending on the wavelength, whereas there is a difference of about 1% or less between the transmittance of the thirteenth sample and the transmittance of the fourteenth sample depending on the wavelength. This is because oxidation of the inorganic deposition layer having a stacked structure of ytterbium (Yb)/bismuth (Bi) in which bismuth (Bi) is deposited directly on ytterbium (Yb) hardly proceeds and, thus, there is no change in the transmittance.

Figure 17:
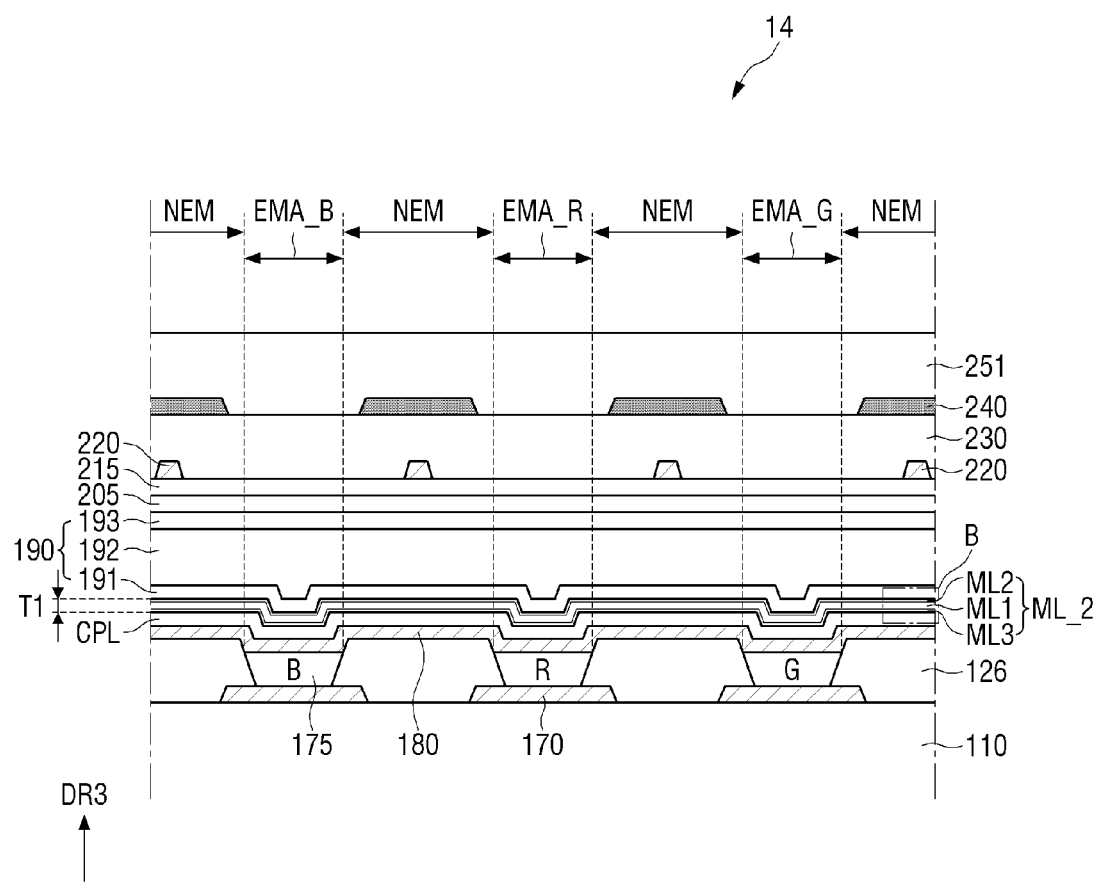
FIG. 17 is a cross-sectional view of a display panel according to still another embodiment.
Figure 18:
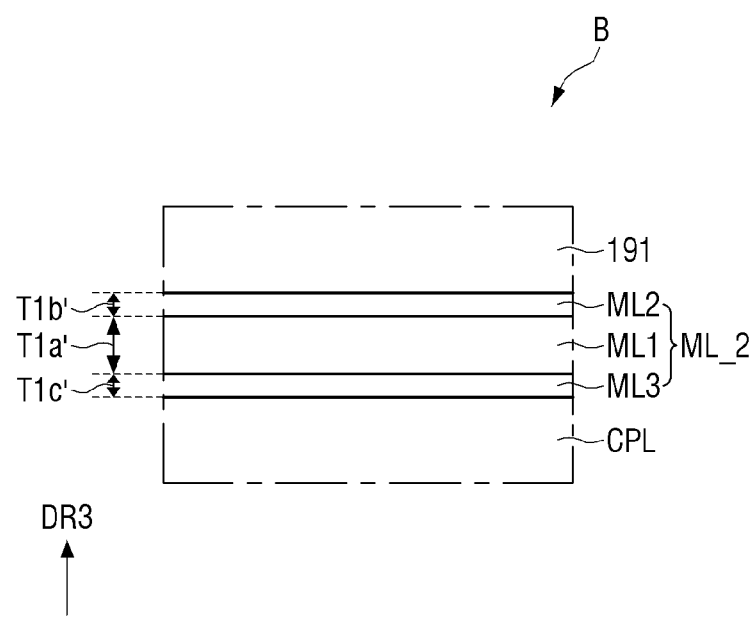
FIG. 18 is an enlarged cross-sectional view of area B of FIG. 17.

FIG. 17 is a cross-sectional view of a display panel according to still another embodiment. FIG. 18 is an enlarged cross-sectional view of area B of FIG. 17.

Referring to FIGS. 17 and 18, an inorganic deposition layer ML_2 of a display panel 14 according to the present embodiment is different from the inorganic deposition layer ML_1 of the display panel 12 of FIG. 11 in that it further includes a third inorganic deposition layer ML3.

More specifically, the inorganic deposition layer ML_2 of the display panel 14 according to the present embodiment may further include the third inorganic deposition layer ML3. The third inorganic deposition layer ML3 may be disposed between the first inorganic deposition layer ML1 and the capping layer CPL. The reducing power of the third inorganic deposition layer ML3 may be smaller than the reducing power of the first inorganic deposition layer ML1. For example, the third inorganic deposition layer ML3 may include the same material as the second inorganic deposition layer ML2. That is, the third inorganic deposition layer ML3 may include bismuth (Bi). The third inorganic deposition layer ML3 and the second inorganic deposition layer ML2 are disposed to have a structure in which the first inorganic deposition layer ML1 is sandwiched therebetween, so that the oxidation of the first inorganic deposition layer ML1 from the top surface and the bottom surface thereof may be suppressed. A thickness T1c' of the third inorganic deposition layer ML3 may be smaller than a thickness T1a' of the first inorganic deposition layer ML1, and may be the same as the thickness T1b' of the second inorganic deposition layer ML2, for example, but the present disclosure is not limited thereto.

Since other descriptions have been made with reference to FIG. 11, detailed descriptions are omitted.

Figure 19:
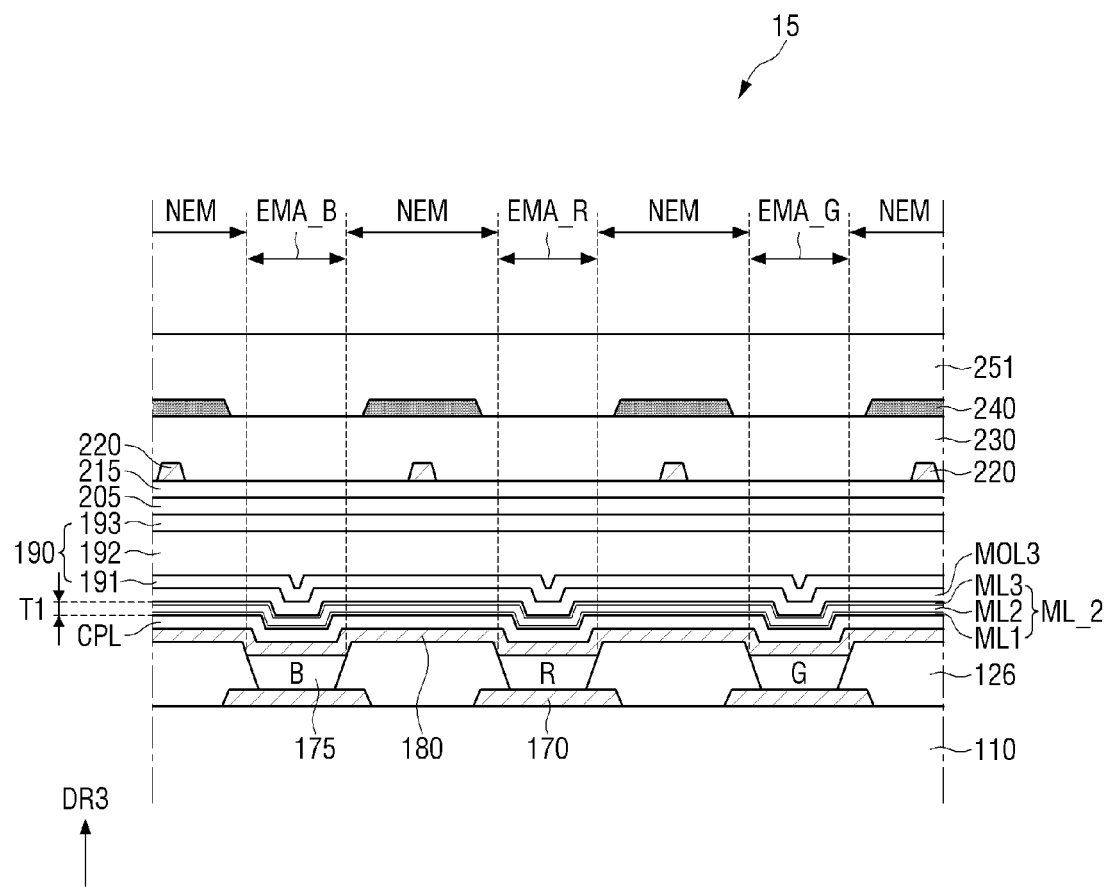
FIG. 19 is a cross-sectional view of a display panel according to still another embodiment.

FIG. 19 is a cross-sectional view of a display panel according to still another embodiment.

Referring to FIG. 19, a display panel 15 according to the present embodiment is different from the display panel 14 of FIG. 17 in that it further includes a third oxide layer MOL3 between the inorganic deposition layer ML_2 and the thin film encapsulation layer 190.

More specifically, the display panel 15 according to the present embodiment may further include the third oxide layer MOL3 between the inorganic deposition layer ML_2 and the thin film encapsulation layer 190. The third oxide layer MOL3 may include the same material as the second oxide layer MOL2 of FIG. 13.

Since other descriptions have been made with reference to FIG. 13, detailed descriptions will be omitted below.

Figure 20:
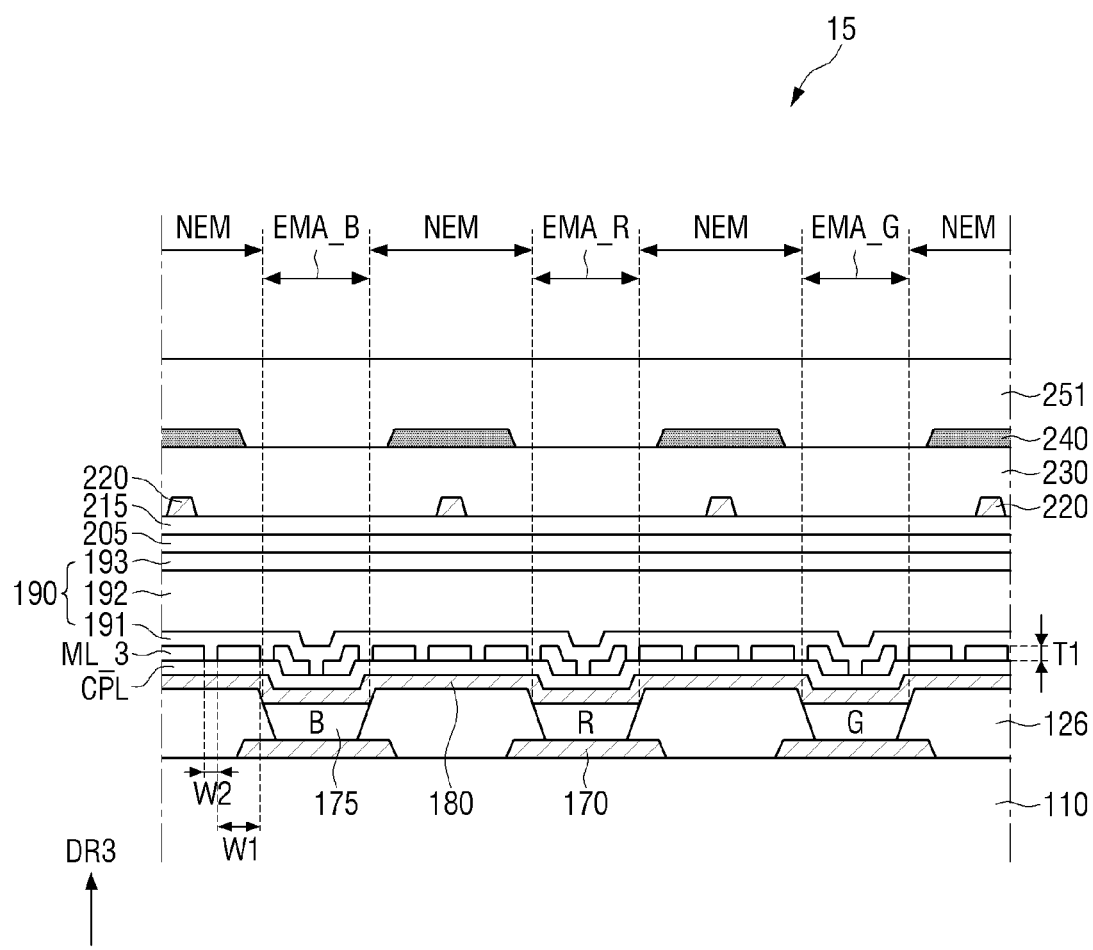
FIG. 20 is a cross-sectional view of a display panel according to still another embodiment.

FIG. 20 is a cross-sectional view of a display panel according to still another embodiment.

Referring to FIG. 20, the display panel 15 according to the present embodiment is different from the display panel 10 of FIG. 8 in that an inorganic deposition layer ML_3 includes a plurality of patterns. More specifically, the inorganic deposition layer ML_3 includes a plurality of patterns, and each of the patterns may be formed in an island shape. For example, a distance W2 between adjacent patterns may be smaller than or equal to about 1% of a width W1 of the pattern. The inorganic deposition layer ML_3 according to the present embodiment includes bismuth (Bi), and bismuth (Bi) has a high tendency that particles agglomerate, so that the inorganic deposition layer ML_3 may be formed by an island growth method.

Since other descriptions have been made with reference to FIG. 8, detailed descriptions will be omitted below.

Figure 21:
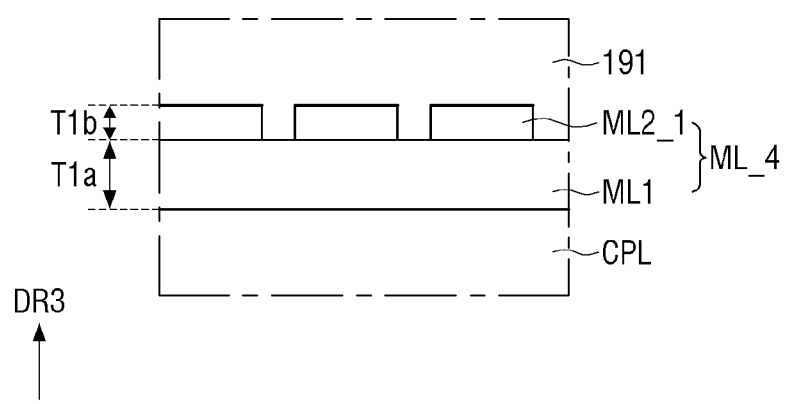
FIG. 21 is a cross-sectional view of an inorganic deposition layer according to still another embodiment.

FIG. 21 is a cross-sectional view of an inorganic deposition layer according to still another embodiment.

Referring to FIG. 21, a second inorganic deposition layer ML2_1 of an inorganic deposition layer ML_4 according to the present embodiment is different from the inorganic deposition layer ML_1 in that the second inorganic deposition layer ML2_1 includes a plurality of patterns similarly to the inorganic deposition layer ML_3 of FIG. 20. As shown in FIG. 21, the first inorganic layer 191 may fill the space between the adjacent patterns of the second inorganic deposition layer ML2_1, and may be in direct contact with the top surface of the first inorganic deposition layer ML1 exposed by the plurality of patterns. Since other detailed descriptions have been made with reference to FIGS. 12 and 20, detailed descriptions will be omitted below.

Figure 22:
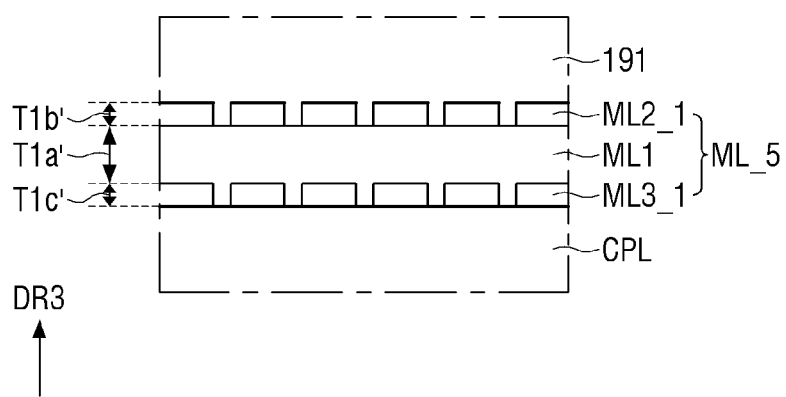
FIG. 22 is a cross-sectional view of an inorganic deposition layer according to still another embodiment.

FIG. 22 is a cross-sectional view of an inorganic deposition layer according to still another embodiment.

Referring to FIG. 22, the second inorganic deposition layer ML2_1 and a third inorganic deposition layer ML3_1 of an inorganic deposition layer ML_5 according to the present embodiment is different from the inorganic deposition layer ML_2 of FIG. 18 in that it includes a plurality of patterns similarly to the inorganic deposition layer ML_3 of FIG. 20. The first inorganic deposition layer ML1 may fill the space between adjacent patterns of the third inorganic deposition layer ML3_1, and may be in direct contact with the top surface of the capping layer CPL exposed by the plurality of patterns. Furthermore, the first inorganic layer 191 may fill the space between adjacent patterns of the second inorganic deposition layer ML2_1, and may be in direct contact with the top surface of the first inorganic deposition layer ML1 exposed by the plurality of patterns.

Since other detailed descriptions have been made with reference to FIGS. 18 and 20, detailed descriptions will be omitted below.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
a substrate;
a first electrode on the substrate;
a bank layer partially exposing a top surface of the first electrode;
a light emitting layer disposed on the partially exposed top surface of the first electrode;
a second electrode on the light emitting layer and the bank layer;
an inorganic deposition layer on the second electrode;
a thin film encapsulation layer on the inorganic deposition layer; and
a capping layer disposed between the inorganic deposition layer and the second electrode,
wherein the inorganic deposition layer comprises:
a first inorganic deposition layer;
a second inorganic deposition layer directly disposed between the first inorganic deposition layer and the thin film encapsulation layer; and
a third inorganic deposition layer directly disposed between the first inorganic deposition layer and the capping layer,
wherein the first inorganic deposition layer contains ytterbium (Yb), and each of the second inorganic deposition layer and the third inorganic deposition layer contains bismuth (Bi),
wherein a thickness of the first inorganic deposition layer is greater than a thickness of each of the second inorganic deposition layer and the third inorganic deposition layer.

2. The display device of claim 1, wherein the inorganic deposition layer contains a metal.

3. The display device of claim 1, wherein the inorganic deposition layer has a thickness of about 500 nm to about 1700 nm.

4. The display device of claim 1, wherein the inorganic deposition layer comprises a plurality of patterns spaced apart from each other.

5. The display device of claim 1, wherein the second inorganic deposition layer comprises a plurality of patterns spaced apart from each other, and the thin film encapsulation layer fills a space between adjacent patterns of the plurality of patterns.

6. The display device of claim 5, wherein in the space, the thin film encapsulation layer is in direct contact with the first inorganic deposition layer.

7. The display device of claim 1, further comprising an oxide layer between the second inorganic deposition layer and the thin film encapsulation layer,
wherein the oxide layer contains a same material as the second inorganic deposition layer, and oxygen atoms.

8. The display device of claim 1, wherein each of the second inorganic deposition layer and the third inorganic deposition layer comprises a plurality of patterns spaced apart from each other.

9. The display device of claim 1, further comprising an oxide layer between the inorganic deposition layer and the thin film encapsulation layer,
wherein the oxide layer contains a same material as the inorganic deposition layer, and oxygen atoms.

10. A display device comprising:
a substrate;
a plurality of first electrodes on the substrate;
a bank layer partially exposing each of top surfaces of the plurality of first electrodes;
a light emitting layer disposed on each of the partially exposed top surfaces of the plurality of first electrodes;

a second electrode on the light emitting layer and the bank layer;

N inorganic deposition layers on the second electrode, wherein N is a natural number greater than or equal to 1;

a thin film encapsulation layer comprising at least one inorganic layer and at least one organic layer and disposed on the inorganic deposition layers; and a capping layer disposed between the inorganic deposition layers and the second electrode;

a touch layer on the thin film encapsulation layer; and an anti-reflection member on the touch layer, wherein the inorganic deposition layers comprise:

a first inorganic deposition layer; and a second inorganic deposition layer directly disposed between the first inorganic deposition layer and the thin film encapsulation layer; and a third inorganic deposition layer directly disposed between the first inorganic deposition layer and the capping layer, wherein the first inorganic deposition layer contains ytterbium (Yb), and each of the second inorganic deposition layer and the third inorganic deposition layer contains bismuth (Bi), wherein a thickness of the first inorganic deposition layer is greater than a thickness of each of the second inorganic deposition layer and the third inorganic deposition layer.

11. The display device of claim 10, wherein the anti-reflection member comprises a light blocking pattern and an anti-reflection layer, the light blocking pattern is positioned between adjacent first electrodes of the plurality of first electrodes in a plan view, and the anti-reflection layer is disposed on the light blocking pattern.

12. The display device of claim 11, wherein the anti-reflection layer contains a resin and an anti-reflection dye dispersed in the resin.

13. The display device of claim 12, wherein the anti-reflection dye contains a porphyrin-based dye, a metal-porphyrin-based dye, methine, triazine, a dipyrromethene-based dye, tetraazaporphyrin, phthalocyanine, oxazine, cyanine, or squarylium.

* * * * *